United States Patent
Inoue et al.

(10) Patent No.: US 11,895,770 B2
(45) Date of Patent: Feb. 6, 2024

(54) COPPER-CLAD LAMINATE, WIRING BOARD, AND COPPER FOIL PROVIDED WITH RESIN

(71) Applicant: PANASONIC INTELLECTUAL PROPERTY MANAGEMENT CO., LTD., Osaka (JP)

(72) Inventors: Yuki Inoue, Fukushima (JP); Tatsuya Arisawa, Fukushima (JP); Shun Yamaguchi, Fukushima (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 108 days.

(21) Appl. No.: 17/281,845

(22) PCT Filed: Sep. 27, 2019

(86) PCT No.: PCT/JP2019/038309
§ 371 (c)(1),
(2) Date: Mar. 31, 2021

(87) PCT Pub. No.: WO2020/071287
PCT Pub. Date: Apr. 9, 2020

(65) Prior Publication Data
US 2022/0015230 A1  Jan. 13, 2022

(30) Foreign Application Priority Data
Oct. 5, 2018 (JP) .............................. JP2018-190282

(51) Int. Cl.
*H05K 1/05* (2006.01)
*G01N 23/2273* (2018.01)
(Continued)

(52) U.S. Cl.
CPC .............. *H05K 1/056* (2013.01); *B32B 15/08* (2013.01); *G01N 23/2273* (2013.01); *H05K 1/09* (2013.01);
(Continued)

(58) Field of Classification Search
CPC .......... H05K 1/056; H05K 1/09; H05K 3/002; H05K 2201/0166; H05K 2201/0355;
(Continued)

(56) References Cited

U.S. PATENT DOCUMENTS

2010/0129676 A1* 5/2010 Fujimoto ............... C08J 3/2463
524/424
2010/0218982 A1 9/2010 Fujiwara et al.
(Continued)

FOREIGN PATENT DOCUMENTS

CN  101547559 A  9/2009
CN  101796132 A  8/2010
(Continued)

OTHER PUBLICATIONS

ISR issued in International Patent Application No. PCT/JP2019/038309, dated Nov. 26, 2019, English translation.

*Primary Examiner* — Hoa C Nguyen
*Assistant Examiner* — John B Freal
(74) *Attorney, Agent, or Firm* — Greenblum & Bernstein, P.L.C.

(57) ABSTRACT

A copper-clad laminate includes an insulating layer and a copper foil in contact with at least one surface of the insulating layer, in which the insulating layer contains a cured product of a resin composition containing a modified polyphenylene ether compound of which a terminal is modified with a substituent having a carbon-carbon unsaturated double bond, a chromium element amount on an exposed surface on which the insulating layer is exposed by
(Continued)

an etching treatment of the copper-clad laminate with a copper chloride solution, measured by X-ray photoelectron spectroscopy is 7.5 at % or less with respect to a total element amount measured by X-ray photoelectron spectroscopy, and a surface roughness of the exposed surface is 2.0 μm or less in terms of ten-point average roughness.

7 Claims, 5 Drawing Sheets

(51) Int. Cl.
  *H05K 1/09* (2006.01)
  *B32B 15/08* (2006.01)
  *H05K 3/00* (2006.01)
(52) U.S. Cl.
  CPC ..... *H05K 3/002* (2013.01); *H05K 2201/0166* (2013.01); *H05K 2201/0355* (2013.01)
(58) Field of Classification Search
  CPC ...... H05K 1/0326; B32B 15/08; B32B 15/20; B32B 2311/12; B32B 2371/00; B32B 2457/08; G01N 23/2273; C08G 65/485
  See application file for complete search history.

(56) References Cited

U.S. PATENT DOCUMENTS

| | | | |
|---|---|---|---|
| 2014/0044918 A1* | 2/2014 | Zeng | C08J 5/244 |
| | | | 524/508 |
| 2014/0073721 A1* | 3/2014 | Yaginuma | C08G 73/0655 |
| | | | 523/451 |
| 2015/0359093 A1 | 12/2015 | Fujiwara et al. | |
| 2017/0118837 A1* | 4/2017 | Miura | H05K 1/034 |
| 2017/0164469 A1 | 6/2017 | Kitai et al. | |
| 2017/0327630 A1* | 11/2017 | Kiya | B32B 27/38 |
| 2018/0297329 A1* | 10/2018 | Kitai | H05K 1/024 |

FOREIGN PATENT DOCUMENTS

| | | |
|---|---|---|
| CN | 104427758 A | 3/2015 |
| CN | 105264123 A | 1/2016 |
| CN | 106465550 A | 2/2017 |
| CN | 107075156 A | 8/2017 |
| JP | 2009-105286 A | 5/2009 |
| JP | 2012-250543 A | 12/2012 |
| JP | 2013-119240 A | 6/2013 |
| JP | 2015-013474 A | 1/2015 |
| JP | 2016-028885 | 3/2016 |
| WO | 2008/090654 A1 | 7/2008 |
| WO | 2017/033784 | 3/2017 |
| WO | 2017/122249 | 7/2017 |

* cited by examiner

COPPER-CLAD LAMINATE, WIRING BOARD, AND COPPER FOIL PROVIDED WITH RESIN

TECHNICAL FIELD

The present invention relates to a copper-clad laminate, a wiring board, and a copper foil with resin.

BACKGROUND ART

As the information processing quantity by various kinds of electronic equipment increases, mounting technologies such as high integration of semiconductor devices to be mounted, densification of wiring, and multi-layering are rapidly progressing. Wiring boards used in various kinds of electronic equipment are required to be, for example, high-frequency compatible wiring boards such as a millimeter-wave radar board for in-vehicle use.

When signals are transmitted to the wiring provided on wiring boards, transmission loss due to the conductor forming the wiring, transmission loss due to the dielectric around the wiring, and the like occur. It is known that these transmission losses are particularly likely to occur when high frequency signals are transmitted to the wiring provided on wiring boards. For this reason, wiring boards are required to diminish the loss at the time of signal transmission in order to increase the signal transmission speed. This is particularly required for wiring boards supporting high frequencies. In order to satisfy this requirement, it is conceivable to use materials having a low dielectric constant and a low dielectric loss tangent as a substrate material for manufacturing the insulating layer constituting wiring boards. Examples of such a substrate material include a resin composition containing polyphenylene ether.

Examples of a metal-clad laminate obtained using such a resin composition containing polyphenylene ether as a substrate material include the metal-clad laminate described in Patent Literature 1. Patent Literature 1 describes a metal-clad laminate which includes a cured insulating layer, a metal layer bonded to the insulating layer containing a polyphenylene ether compound, and an intermediate layer which contains a silane compound and is interposed between the insulating layer and the metal layer and in which the metal layer has a joint surface bonded to the insulating layer with the intermediate layer interposed therebetween and the ten-point average roughness Rz of the joint surface is 0.5 µm or more and 4 µm or less. According to Patent Literature 1, it is disclosed that a metal-clad laminate is obtained from which a printed wiring board with diminished loss at the time of signal transmission can be manufactured.

As described above, wiring boards such as printed wiring boards are required to have a further increased signal transmission speed in order to support high frequencies. Wiring boards used in various kinds of electronic equipment are also required to be hardly affected by changes in the external environment, and the like. For example, high heat resistance is required so that delamination does not occur at the time of heating. In order to satisfy these requirements, various studies on copper-clad laminates, wiring boards, and copper foils with resins have been conducted.

CITATION LIST

Patent Literature

Patent Literature 1: JP 2016-28885 A

SUMMARY OF INVENTION

The present invention has been made in view of such circumstances, and an object thereof is to provide a copper-clad laminate and a copper foil with resin from which a wiring board having a high signal transmission speed and high heat resistance can be suitably manufactured. Another object of the present invention is to provide a wiring board having a high signal transmission speed and high heat resistance.

An aspect of the present invention is a copper-clad laminate including an insulating layer and a copper foil in contact with at least one surface of the insulating layer, in which the insulating layer contains a cured product of a resin composition containing a modified polyphenylene ether compound of which a terminal is modified with a substituent having a carbon-carbon unsaturated double bond, a chromium element amount on an exposed surface on which the insulating layer is exposed by an etching treatment of the copper-clad laminate with a copper chloride solution, measured by X-ray photoelectron spectroscopy is 7.5 at % or less with respect to a total element amount measured by X-ray photoelectron spectroscopy, and a surface roughness of the exposed surface is 2.0 µm or less in terms of ten-point average roughness.

In the copper-clad laminate, it is preferable that the substituent is a group represented by the following Formula (1) or the following Formula (2).

[Chem. 1]

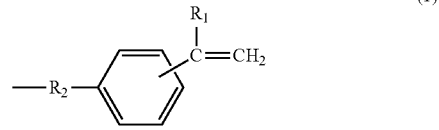

In Formula (1), $R_1$ represents a hydrogen atom or an alkyl group having 1 to 10 carbon atoms and $R_2$ represents an alkylene group having 1 to 10 carbon atoms or a direct bond.

[Chem. 2]

In Formula (2), $R_3$ represents a hydrogen atom or an alkyl group having 1 to 10 carbon atoms.

Another aspect of the present invention is a copper foil with resin, including a resin layer and a copper foil in contact with at least one surface of the resin layer, in which the resin layer contains a resin composition containing a modified polyphenylene ether compound of which a terminal is modified with a substituent having a carbon-carbon unsaturated double bond or a semi-cured product of the resin composition, a chromium element amount on an exposed surface, on which the resin layer is exposed after the copper foil with resin in which the resin layer has been cured is etched with a copper chloride solution, measured by X-ray photoelectron spectroscopy is 7.5 at % or less with respect to a total element amount measured by X-ray photoelectron spectroscopy, and a surface roughness of the exposed surface is 2.0 μm or less in terms of ten-point average roughness.

DESCRIPTION OF EMBODIMENTS

Figure 1:
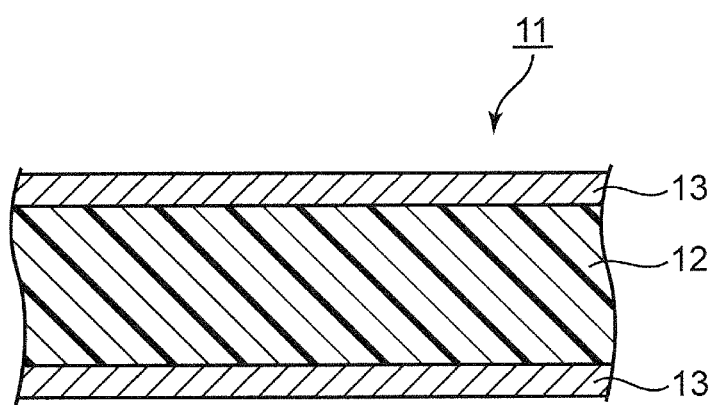
FIG. 1 is a schematic sectional view illustrating an example of a copper-clad laminate according to an embodiment of the present invention.

In a wiring board obtained by forming wiring by partially removing the copper foil provided in the copper-clad laminate, wiring formed of copper foil does not exist between these insulating layers even when another insulating layer is formed on the surface of the insulating layer exposed by the wiring formation. From this fact, it has been considered that the delamination between the insulating layers is not affected by the copper foil provided in the copper-clad laminate used to obtain a wiring board.

However, according to the studies by the present inventors, it has been found out that susceptibility to delamination that occurs between the insulating layers differs depending on the copper foil provided in the copper-clad laminate. The present inventors have presumed that the exposed surface and another insulating layer are suitably attached to each other and the state of the exposed surface does not affect the occurrence of delamination when a conductor derived from copper foil does not exist at all on the exposed surface that is the surface of the insulating layer exposed by wiring formation. From this fact, the present inventors have presumed that metal components derived from the copper foil may slightly remain on the exposed surface when the copper foil in the copper-clad laminate is removed by etching. The present inventors have presumed that the state of the exposed surface is greatly affected by the surface roughness. The present inventors have conducted various studies on the effects of the remaining metal components and surface roughness and, as a result, found out that the susceptibility to delamination that occurs between the insulating layers differs depending on the amount of chromium element existing on the exposed surface on which the insulating layer is exposed by the etching treatment of the copper-clad laminate with a copper chloride solution and the surface roughness.

As a result of various studies, the present inventors have found out that occurrence of the delamination can be suppressed in a wiring board obtained using a copper-clad laminate in which the exposed surface on which the insulating layer is exposed by the etching treatment of the copper-clad laminate with a copper chloride solution has a predetermined chromium element amount and a predetermined surface roughness. In other words, the present inventors have found out that occurrence of the delamination can be suppressed in a wiring board obtained using a copper-clad laminate in which the chromium element amount and surface roughness of the exposed surface on which the insulating layer is exposed by a predetermined etching treatment are predetermined values without regulating the copper foil removal conditions (etching treatment conditions) and the copper foil composition. From these facts, the present invention as described below has been conceived.

Hereinafter, embodiments according to the present invention will be described, but the present invention is not limited thereto.

[Copper-Clad Laminate]

The copper-clad laminate according to the embodiments of the present invention includes an insulating layer and a copper foil in contact with at least one surface of the insulating layer. As illustrated in FIG. 1, this copper-clad laminate 11 includes an insulating layer 12 and copper foils 13 disposed so as to be in contact with both surfaces of the insulating layer 12. The copper-clad laminate may be provided with a copper foil in contact with only one surface of the insulating layer. FIG. 1 is a schematic sectional view illustrating the configuration of the copper-clad laminate 11 according to the present embodiment.

In the copper-clad laminate 11, the insulating layer 12 contains a cured product of a resin composition containing a modified polyphenylene ether compound of which a terminal is modified with a substituent having a carbon-carbon unsaturated double bond. In the copper-clad laminate 11, the chromium element amount on the exposed surface on which the insulating layer 12 is exposed by an etching treatment of the copper-clad laminate 11 with a copper chloride solution measured by X-ray photoelectron spectroscopy (XPS) is 7.5 at % or less with respect to the total element amount measured by XPS. In the copper-clad laminate 11, the surface roughness of the exposed surface is 2.0 μm or less in terms of ten-point average roughness.

In such a copper-clad laminate, it is first considered that the heat resistance of the insulating layer can be enhanced since the cured product contained in the insulating layer is a cured product obtained by curing a resin composition containing the modified polyphenylene ether compound.

As described above, the present inventors have found out that the delamination that occurs between the insulating layer between wirings and another insulating layer when another insulating layer is formed on the surface of the insulating layer existing between wirings is affected by the copper foil that originally has existed even though a copper foil does not exist between the insulating layers in a wiring board manufactured from a copper-clad laminate. From this fact, it is considered that the etching residue derived from the copper foil exists on the exposed surface on which the insulating layer is exposed by an etching treatment. The present inventors have presumed that delamination is likely to occur at the time of heating when a compound containing a chromium element exists as this etching residue. It is considered that the amount of chromium element also existing on the surface of the insulating layer existing between the wirings in a wiring board manufactured from the copper-clad laminate, namely, the amount of a compound containing a chromium element is small when the amount of chromium element existing on the exposed surface is small as described above. From this fact, it is considered that the copper-clad laminate exhibits high heat resistance so that delamination can be sufficiently suppressed even when heating is performed.

From the above, it is considered that the copper-clad laminate exhibits high heat resistance.

The dielectric constant and the dielectric loss tangent are low since the cured product contained in the insulating layer is a cured product obtained by curing a resin composition containing the modified polyphenylene ether compound. From this fact, it is considered that it is possible to diminish the transmission loss caused by the dielectric around the wiring and increase the signal transmission speed in this wiring board.

It is considered that the smoothness of the contact surface between the copper foil and the insulating layer is also high since the surface roughness of the exposed surface is low. From this fact, it is considered that the smoothness of the contact surface between the wiring and the insulating layer is also high in a wiring board obtained from the copper-clad laminate. It is considered that the signal for transmitting the wiring is concentrated near the surface of the conductor constituting the wiring by the skin effect. It is considered that this effect is more remarkable as the signal for transmitting the wiring has a higher frequency. As the contact surface between the wiring and the insulating layer is smooth, the signal flowing through the wiring flows near the surface having high smoothness and the transmission distance is shorter. From this fact, it is considered that it is possible to diminish the transmission loss caused by the conductor forming the wiring and increase the signal transmission speed in this wiring board.

From this fact, it is considered that it is possible to diminish the transmission loss caused by the conductor forming the wiring and the transmission loss caused by the dielectric around the wiring and increase the signal transmission speed in this wiring board.

From the above, it is considered that the copper-clad laminate is a copper-clad laminate from which a wiring board having a high signal transmission speed and high heat resistance can be suitably manufactured.

(Resin Composition)

As described above, the resin composition used in the present embodiment contains the modified polyphenylene ether compound.

(Modified Polyphenylene Ether Compound)

The modified polyphenylene ether compound used in the present embodiment is not particularly limited as long as it is a modified polyphenylene ether of which the terminal is modified with a substituent having a carbon-carbon unsaturated double bond.

The substituent having a carbon-carbon unsaturated double bond is not particularly limited. Examples of the substituent include a substituent represented by the following Formula (1) or the following Formula (2).

[Chem. 3]

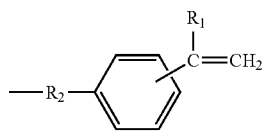

(1)

In Formula (1), $R_1$ represents a hydrogen atom or an alkyl group having 1 to 10 carbon atoms and $R_2$ represents an alkylene group having 1 to 10 carbon atoms or a direct bond.

[Chem. 4]

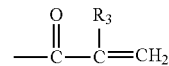

(2)

In Formula (2), $R_3$ represents a hydrogen atom or an alkyl group having 1 to 10 carbon atoms.

Examples of the substituent represented by Formula (1) include vinylbenzyl groups (ethenylbenzyl groups) such as a p-ethenylbenzyl group and an m-ethenylbenzyl group.

Examples of the substituent represented by Formula (2) include an acrylate group and a methacrylate group.

The modified polyphenylene ether has a polyphenylene ether chain in the molecule and preferably has, for example, a repeating unit represented by the following Formula (3) in the molecule.

[Chem. 5]

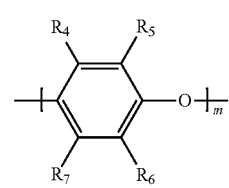

(3)

In Formula (3), m represents 1 to 50. $R^4$ to $R^7$ are independent of each other. In other words, $R^4$ to $R^7$ may be the same group as or different groups from each other. $R^4$ to $R^7$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

Specific examples of the respective functional groups mentioned in $R^4$ to $R^7$ include the following.

The alkyl group is not particularly limited and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

The alkenyl group is not particularly limited and is, for example, preferably an alkenyl group having 2 to 18 carbon atoms, more preferably an alkenyl group having 2 to 10 carbon atoms. Specific examples thereof include a vinyl group, an allyl group, and a 3-butenyl group.

The alkynyl group is not particularly limited and is, for example, preferably an alkynyl group having 2 to 18 carbon atoms, more preferably an alkynyl group having 2 to 10 carbon atoms. Specific examples thereof include an ethynyl group and a prop-2-yn-1-yl group (propargyl group).

The alkylcarbonyl group is not particularly limited as long as it is a carbonyl group substituted with an alkyl group and is, for example, preferably an alkylcarbonyl group having 2 to 18 carbon atoms, more preferably an alkylcarbonyl group having 2 to 10 carbon atoms. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group and is, for example, preferably an alkenylcarbonyl group having 3 to 18 carbon atoms, more preferably an alkenylcarbonyl group having 3 to 10 carbon atoms. Specific examples thereof include an acryloyl group, a methacryloyl group, and a crotonoyl group.

The alkynylcarbonyl group is not particularly limited as long as it is a carbonyl group substituted with an alkynyl group and is, for example, preferably an alkynylcarbonyl group having 3 to 18 carbon atoms, more preferably an alkynylcarbonyl group having 3 to 10 carbon atoms. Specific examples thereof include a propioloyl group.

The weight average molecular weight (Mw) of the modified polyphenylene ether compound used in the present embodiment is not particularly limited. Specifically, the weight average molecular weight is preferably 500 to 5000, more preferably 800 to 4000, and still more preferably 1000 to 3000. The weight average molecular weight here may be measured by a general molecular weight measurement method, and specific examples thereof include a value measured by gel permeation chromatography (GPC). In a case where the modified polyphenylene ether compound has a repeating unit represented by Formula (3) in the molecule, m is preferably a numerical value so that the weight average molecular weight of the modified polyphenylene ether compound is in such a range. Specifically, m is preferably 1 to 50.

When the weight average molecular weight of the modified polyphenylene ether compound is in such a range, the modified polyphenylene ether compound exhibits the excellent low dielectric properties of polyphenylene ether and not only imparts superior heat resistance to the cured product but also exhibits excellent moldability. This is considered to be due to the following. When the weight average molecular weight of ordinary polyphenylene ether is in such a range, the heat resistance of the cured product tends to decrease since the molecular weight is relatively low. With regard to this point, it is considered that a cured product exhibiting sufficiently high heat resistance is obtained since the modified polyphenylene ether compound has an unsaturated double bond at the terminal. When the weight average molecular weight of the modified polyphenylene ether compound is in such a range, the modified polyphenylene ether compound has a relatively low molecular weight and is considered to be excellent in moldability as well. Hence, it is considered that such a modified polyphenylene ether compound is not only excellent in heat resistance of the cured product but also excellent in moldability.

In the modified polyphenylene ether compound used in the present embodiment, the average number of the substituents (number of terminal functional groups) at the terminal of the molecule per one molecule of modified polyphenylene ether is not particularly limited. Specifically, the number is preferably 1 to 5, more preferably 1 to 3, still more preferably 1.5 to 3. When this number of functional groups is too small, sufficient heat resistance of the cured product tends to be hardly attained. When the number of terminal functional groups is too large, the reactivity is too high and, for example, there is a possibility that troubles such as a decrease in storage stability of the resin composition and a decrease in fluidity of the resin composition may occur. In other words, when such modified polyphenylene ether is used, for example, there is a possibility that molding defects such as voids generated at the time of multilayer molding may occur by insufficient fluidity and the like and this may cause a moldability problem so that it is difficult to obtain a highly reliable wiring board.

The number of terminal functional groups in the modified polyphenylene ether compound includes a numerical value expressing the average value of the substituents per one molecule of all the modified polyphenylene ether compounds existing in 1 mole of the modified polyphenylene ether compound. This number of terminal functional groups can be determined, for example, by measuring the number of hydroxyl groups remaining in the obtained modified polyphenylene ether compound and calculating the number of hydroxyl groups decreased from the number of hydroxyl groups in the polyphenylene ether before being modified. The number of hydroxyl groups decreased from the number of hydroxyl groups in the polyphenylene ether before being modified is the number of terminal functional groups. With regard to the method for measuring the number of hydroxyl groups remaining in the modified polyphenylene ether compound, the number of hydroxyl groups can be determined by adding a quaternary ammonium salt (tetraethylammonium hydroxide) to be associated with a hydroxyl group to a solution of the modified polyphenylene ether compound and measuring the UV absorbance of the mixed solution.

The intrinsic viscosity of the modified polyphenylene ether compound used in the present embodiment is not particularly limited. Specifically, the intrinsic viscosity is preferably 0.03 to 0.12 dl/g, more preferably 0.04 to 0.11 dl/g, still more preferably 0.06 to 0.095 dl/g. When the intrinsic viscosity is too low, the molecular weight tends to be low and low dielectric properties such as a low dielectric constant and a low dielectric loss tangent tend to be hardly attained. When the intrinsic viscosity is too high, the viscosity is high, sufficient fluidity is not attained, and the moldability of the cured product tends to decrease. Hence, if the intrinsic viscosity of the modified polyphenylene ether compound is in the above range, excellent heat resistance and moldability of the cured product can be realized.

The intrinsic viscosity here is an intrinsic viscosity measured in methylene chloride at 25° C. and more specifically is, for example, a value acquired by measuring the intrinsic viscosity of a methylene chloride solution (liquid temperature: 25° C.) at 0.18 g/45 ml using a viscometer. Examples of the viscometer include AVS500 Visco System manufactured by SCHOTT Instruments GmbH.

Examples of the modified polyphenylene ether compound include a modified polyphenylene ether compound represented by the following Formula (4) and a modified polyphenylene ether compound represented by the following Formula (5). As the modified polyphenylene ether compound, these modified polyphenylene ether compounds may be used singly or two kinds of these modified polyphenylene ether compounds may be used in combination.

[Chem. 6]

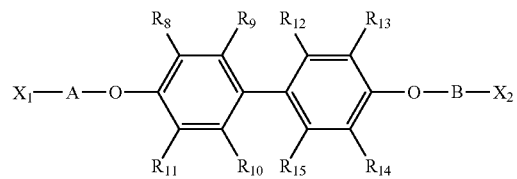

(4)

-continued

[Chem. 7]

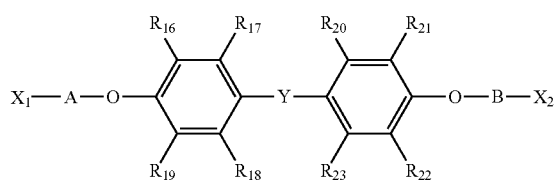

(5)

In Formulas (4) and (5), $R_8$ to $R_{15}$ and $R_{16}$ to $R_{23}$ each independently represent a hydrogen atom, an alkyl group, an alkenyl group, an alkynyl group, a formyl group, an alkylcarbonyl group, an alkenylcarbonyl group, or an alkynylcarbonyl group. $X_1$ and $X_2$ each independently represent a substituent having a carbon-carbon unsaturated double bond. A and B each represent repeating units represented by the following Formulas (6) and (7). In Formula (5), Y represents a linear, branched, or cyclic hydrocarbon having 20 or less carbon atoms.

[Chem. 8]

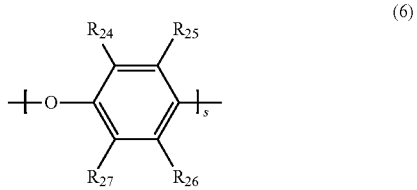

(6)

[Chem. 9]

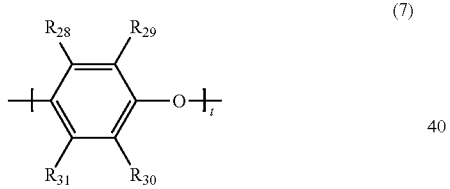

(7)

In Formulas (6) and (7), s and t each represent 0 to 20. $R_{24}$ to $R_{27}$ and $R_{28}$ to $R_{31}$ each independently represent a hydrogen atom, an alkyl group, an alkenyl group, an alkynyl group, a formyl group, an alkylcarbonyl group, an alkenylcarbonyl group, or an alkynylcarbonyl group.

The modified polyphenylene ether compound represented by Formula (4) and the modified polyphenylene ether compound represented by Formula (5) are not particularly limited as long as they are compounds satisfying the above configuration. Specifically, in Formulas (4) and (5), $R_8$ to $R_{15}$ and $R_{16}$ to $R_{23}$ are independent of each other as described above. In other words, $R_8$ to $R_{15}$ and $R_{16}$ to $R_{23}$ may be the same group as or different groups from each other. $R_8$ to $R_{15}$ and $R_{16}$ to $R_{23}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

In Formulas (6) and (7), s and t each preferably represent 0 to 20 as described above. It is preferable that s and t represent numerical values so that the sum of s and t is 1 to 30. Hence, it is more preferable that s represents 0 to 20, t represents 0 to 20, and the sum of s and t represents 1 to 30. $R_{24}$ to $R_{27}$ and $R_{28}$ to $R_{31}$ are independent of each other. In other words, $R_{24}$ to $R_{27}$ and $R_{28}$ to $R_{31}$ may be the same group as or different groups from each other. $R_{24}$ to $R_{27}$ and $R_{28}$ to $R_{31}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

$R_8$ to $R_{31}$ are the same as $R_5$ to $R_8$ in Formula (3).

In Formula (5), Y represents a linear, branched, or cyclic hydrocarbon having 20 or less carbon atoms as described above. Examples of Y include a group represented by the following Formula (8).

[Chem. 10]

(8)

In Formula (8), $R_{32}$ and $R_{33}$ each independently represent a hydrogen atom or an alkyl group. Examples of the alkyl group include a methyl group. Examples of the group represented by Formula (8) include a methylene group, a methylmethylene group, and a dimethylmethylene group. Among these, a dimethylmethylene group is preferable.

More specific examples of the modified polyphenylene ether compound represented by Formula (4) include a modified polyphenylene ether compound represented by the following Formula (9).

[Chem. 11]

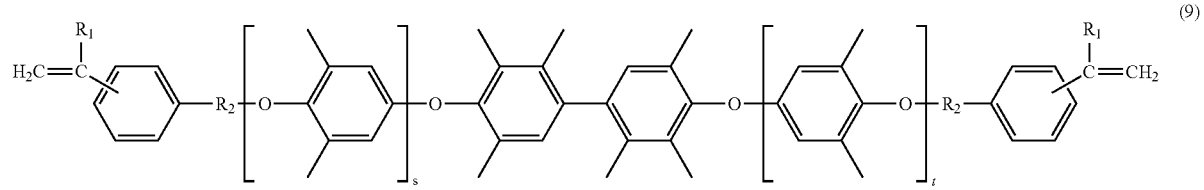

(9)

More specific examples of the modified polyphenylene ether compound represented by Formula (5) include a modified polyphenylene ether compound represented by the following Formula (10) and a modified polyphenylene ether compound represented by the following Formula (11).

[Chem. 12]

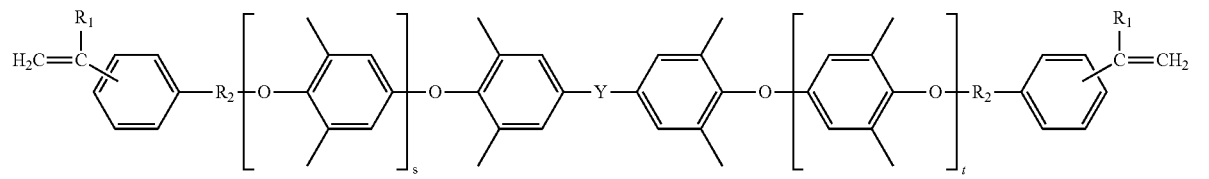

(10)

[Chem. 13]

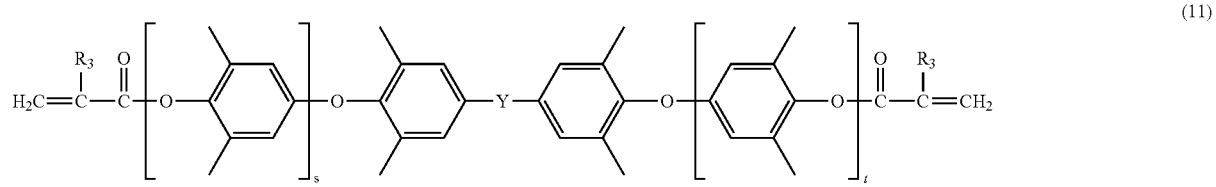

(11)

In Formulas (9) to (11), s and t are the same as s and t in Formulas (6) and (7). In Formulas (9) and (10), $R_1$ and $R_2$ are the same as $R_1$ and $R_2$ in Formulas (1). In Formulas (10) and (11), Y is the same as Y in the above Formula (5). In Formula (11), $R_3$ is the same as $R_3$ in Formula (2).

The method for synthesizing the modified polyphenylene ether compound used in the present embodiment is not particularly limited as long as a modified polyphenylene ether compound of which the terminal is modified with a substituent having a carbon-carbon unsaturated double bond can be synthesized. Specific examples thereof include a method in which polyphenylene ether is reacted with a compound in which a substituent having a carbon-carbon unsaturated double bond is bonded to a halogen atom.

Examples of the compound in which a substituent having a carbon-carbon unsaturated double bond is bonded to a halogen atom include compounds in which substituents represented by Formulas (2) and (3) are bonded to a halogen atom. Specific examples of the halogen atom include a chlorine atom, a bromine atom, an iodine atom, and a fluorine atom. Among these, a chlorine atom is preferable. More specific examples of the compound in which a substituent having a carbon-carbon unsaturated double bond is bonded to a halogen atom include p-chloromethylstyrene and m-chloromethylstyrene.

Polyphenylene ether which is a raw material is not particularly limited as long as a predetermined modified polyphenylene ether compound can be finally synthesized. Specific examples thereof include those containing polyphenylene ether composed of 2,6-dimethylphenol and at least one of a bifunctional phenol and a trifunctional phenol and polyphenylene ether such as poly(2,6-dimethyl-1,4-phenylene oxide) as a main component. The bifunctional phenol is a phenol compound having two phenolic hydroxyl groups in the molecule, and examples thereof include tetramethyl bisphenol A. The trifunctional phenol is a phenol compound having three phenolic hydroxyl groups in the molecule.

Examples of the method for synthesizing the modified polyphenylene ether compound include the methods described above. Specifically, polyphenylene ether as described above and a compound in which a substituent having a carbon-carbon unsaturated double bond is bonded to a halogen atom are dissolved in a solvent and stirred. By doing so, polyphenylene ether reacts with the compound in which a substituent having a carbon-carbon unsaturated double bond is bonded to a halogen atom, and the modified polyphenylene ether compound used in the present embodiment is obtained.

The reaction is preferably conducted in the presence of an alkali metal hydroxide. By doing so, it is considered that this reaction suitably proceeds. This is considered to be because the alkali metal hydroxide functions as a dehydrohalogenating agent, specifically, a dehydrochlorinating agent. In other words, it is considered that the alkali metal hydroxide eliminates the hydrogen halide from the phenol group in polyphenylene ether and the compound in which a substituent having a carbon-carbon unsaturated double bond is bonded to a halogen atom, and by doing so, the substituent having a carbon-carbon unsaturated double bond is bonded to the oxygen atom of the phenol group instead of the hydrogen atom of the phenol group in the polyphenylene ether.

The alkali metal hydroxide is not particularly limited as long as it can act as a dehalogenating agent, and examples thereof include sodium hydroxide. The alkali metal hydroxide is usually used in the form of an aqueous solution and is specifically used as an aqueous sodium hydroxide solution.

The reaction conditions such as reaction time and reaction temperature also vary depending on the compound in which a substituent having a carbon-carbon unsaturated double bond is bonded to a halogen atom and the like, and are not particularly limited as long as they are conditions under which the reaction as described above suitably proceeds. Specifically, the reaction temperature is preferably room temperature to 100° C., more preferably 30° C. to 100° C. The reaction time is preferably 0.5 to 20 hours, more preferably 0.5 to 10 hours.

The solvent used at the time of the reaction is not particularly limited as long as it can dissolve polyphenylene ether and the compound in which a substituent having a carbon-carbon unsaturated double bond is bonded to a halogen atom, and does not inhibit the reaction of polyphenylene ether with the compound in which a substituent having a carbon-carbon unsaturated double bond is bonded to a halogen atom. Specific examples thereof include toluene.

The above reaction is preferably conducted in the presence of not only an alkali metal hydroxide but also a phase transfer catalyst. In other words, the above reaction is preferably conducted in the presence of an alkali metal hydroxide and a phase transfer catalyst. By doing so, it is considered that the above reaction more suitably proceeds. This is considered to be due to the following. This is considered to be because the phase transfer catalyst is a catalyst which has a function of taking in the alkali metal hydroxide, is soluble in both phases of a phase of a polar solvent such as water and a phase of a non-polar solvent such as an organic solvent, and can transfer between these phases. Specifically, in a case where an aqueous sodium hydroxide solution is used as an alkali metal hydroxide and an organic solvent, such as toluene, which is incompatible with water is used as a solvent, it is considered that even when the aqueous sodium hydroxide solution is dropped into the solvent subjected to the reaction, the solvent and the aqueous sodium hydroxide solution are separated from each other and the sodium hydroxide is hardly transferred to the solvent. In that case, it is considered that the aqueous sodium hydroxide solution added as an alkali metal hydroxide hardly contributes to the promotion of the reaction. In contrast, when the reaction is conducted in the presence of an alkali metal hydroxide and a phase transfer catalyst, it is considered that the alkali metal hydroxide is transferred to the solvent in the state of being taken in the phase transfer catalyst and the aqueous sodium hydroxide solution is likely to contribute to the promotion of the reaction. For this reason, when the reaction is conducted in the presence of an alkali metal hydroxide and a phase transfer catalyst, it is considered that the above reaction more suitably proceeds.

The phase transfer catalyst is not particularly limited, and examples thereof include quaternary ammonium salts such as tetra-n-butylammonium bromide.

The resin composition used in the present embodiment preferably contains a modified polyphenylene ether compound obtained as described above as the modified polyphenylene ether compound.

(Curing Agent)

The resin composition may contain a curing agent. The resin composition may not contain a curing agent but preferably contains a curing agent in order to suitably cure the modified polyphenylene ether compound. The curing agent is a curing agent capable of reacting with the polyphenylene ether compound and curing the resin composition containing the polyphenylene ether compound. The curing agent is not particularly limited as long as it is a curing agent capable of curing a resin composition containing the polyphenylene ether compound. Examples of the curing agent include styrene, styrene derivatives, a compound having an acryloyl group in the molecule, a compound having a methacryloyl group in the molecule, a compound having a vinyl group in the molecule, a compound having an allyl group in the molecule, a compound having an acenaphthylene structure in the molecule, a compound having a maleimide group in the molecule, and a compound having an isocyanurate group in the molecule.

Examples of the styrene derivatives include bromostyrene and dibromostyrene.

The compound having an acryloyl group in the molecule is an acrylate compound. Examples of the acrylate compound include a monofunctional acrylate compound having one acryloyl group in the molecule and a polyfunctional acrylate compound having two or more acryloyl groups in the molecule. Examples of the monofunctional acrylate compound include methyl acrylate, ethyl acrylate, propyl acrylate, and butyl acrylate. Examples of the polyfunctional acrylate compound include diacrylate compounds such as tricyclodecanedimethanol diacrylate.

The compound having a methacryloyl group in the molecule is a methacrylate compound. Examples of the methacrylate compound include a monofunctional methacrylate compound having one methacryloyl group in the molecule and a polyfunctional methacrylate compound having two or more methacryloyl groups in the molecule. Examples of the monofunctional methacrylate compound include methyl methacrylate, ethyl methacrylate, propyl methacrylate, and butyl methacrylate. Examples of the polyfunctional methacrylate compound include dimethacrylate compounds such as tricyclodecanedimethanol dimethacrylate.

The compound having a vinyl group in the molecule is a vinyl compound. Examples of the vinyl compound include a monofunctional vinyl compound (monovinyl compound) having one vinyl group in the molecule and a polyfunctional vinyl compound having two or more vinyl groups in the molecule. Examples of the polyfunctional vinyl compound include divinylbenzene and polybutadiene.

The compound having an allyl group in the molecule is an allyl compound. Examples of the allyl compound include a monofunctional allyl compound having one allyl group in the molecule and a polyfunctional allyl compound having two or more allyl groups in the molecule. Examples of the polyfunctional allyl compound include triallyl isocyanurate compounds such as triallyl isocyanurate (TAIC), diallyl bisphenol compounds, and diallyl phthalate (DAP).

The compound having an acenaphthylene structure in the molecule is an acenaphthylene compound. Examples of the acenaphthylene compound include acenaphthylene, alkylacenaphthylenes, halogenated acenaphthylenes, and phenylacenaphthylenes. Examples of the alkyl acenaphthylenes include 1-methyl acenaphthylene, 3-methyl acenaphthylene, 4-methyl acenaphthylene, 5-methyl acenaphthylene, 1-ethyl acenaphthylene, 3-ethyl acenaphthylene, 4-ethyl acenaphthylene, and 5-ethyl acenaphthylene. Examples of the halogenated acenaphthylenes include 1-chloroacenaphthylene, 3-chloroacenaphthylene, 4-chloroacenaphthylene, 5-chloroaeenaphthylene, 1-bromoacenaphthylene, 3-bromoacenaphthylene, 4-bromoacenaphthylene, and 5-bromoacenaphthylene. Examples of the phenylacenaphthylenes include 1-phenylacenaphthylene, 3-phenylacenaphthylene, 4-phenylacenaphthylene, and 5-phenylacenaphthylene. The acenaphthylene compound may be a monofunctional acenaphthylene compound having one acenaphthylene structure in the molecule as described above or may be a polyfunctional acenaphthylene compound having two or more acenaphthylene structures in the molecule.

The compound having a maleimide group in the molecule is a maleimide compound. Examples of the maleimide compound include a monofunctional maleimide compound having one maleimide group in the molecule, a polyfunctional maleimide compound having two or more maleimide groups in the molecule, and a modified maleimide compound. Examples of the modified maleimide compound include a modified maleimide compound in which a part of the molecule is modified with an amine compound, a modified maleimide compound in which a part of the molecule is modified with a silicone compound, and a modified maleimide compound in which a part of the molecule is modified with an amine compound and a silicone compound.

The compound having an isocyanurate group in the molecule is an isocyanurate compound. Examples of the isocyanurate compound include a compound having an alkenyl group in the molecule (alkenyl isocyanurate compound), and examples thereof include a trialkenyl isocyanurate compound such as triallyl isocyanurate (TAIC).

Among the above, the curing agent is, for example, preferably the polyfunctional acrylate compound, the polyfunctional methacrylate compound, the polyfunctional vinyl compound, the styrene derivative, the allyl compound, the maleimide compound, the acenaphthylene compound, and the isocyanurate compound, and more preferably the polyfunctional vinyl compound, the acenaphthylene compound, and the allyl compound. Divinylbenzene is preferable as the polyfunctional vinyl compound. As the allyl compound, an allyl isocyanurate compound having two or more allyl groups in the molecule is preferable, and triallyl isocyanurate (TAIC) is more preferable.

As the curing agent, the above curing agents may be used singly or in combination of two or more kinds thereof.

The weight average molecular weight of the curing agent is not particularly limited and is, for example, preferably 100 to 5000, more preferably 100 to 4000, still more preferably 100 to 3000. When the weight average molecular weight of the curing agent is too low, the curing agent may easily volatilize from the compounding component system of the resin composition. When the weight average molecular weight of the curing agent is too high, the viscosity of the varnish of the resin composition and the melt viscosity at the time of heat molding may be too high. Hence, a resin composition imparting superior heat resistance to the cured product is obtained when the weight average molecular weight of the curing agent is within such a range. It is considered that this is because the resin composition containing the polyphenylene ether compound can be suitably cured by the reaction of the curing agent with the polyphenylene ether compound. The weight average molecular weight here may be measured by a general molecular weight measurement method, and specific examples thereof include a value measured by gel permeation chromatography (GPC).

The average number (number of functional groups) of the functional groups which contribute to the reaction of the curing agent with the polyphenylene ether compound per one molecule of the curing agent varies depending on the weight average molecular weight of the curing agent, but is, for example, preferably 1 to 20, more preferably 2 to 18. When this number of functional groups is too small, sufficient heat resistance of the cured product tends to be hardly attained. When the number of functional groups is too large, the reactivity is too high and, for example, troubles such as a decrease in the storage stability of the resin composition or a decrease in the fluidity of the resin composition may occur.

The content of the modified polyphenylene ether compound is preferably 30 to 90 parts by mass, more preferably 50 to 90 parts by mass with respect to 100 parts by mass of the sum of the modified polyphenylene ether compound and the curing agent. The content of the curing agent is preferably 10 to 70 parts by mass, more preferably 10 to 50 parts by mass with respect to 100 parts by mass of the sum of the modified polyphenylene ether compound and the curing agent. In other words, the content ratio of the modified polyphenylene ether compound to the curing agent is preferably 90:10 to 30:70, preferably 90:10 to 50:50 in terms of mass ratio. If the respective contents of the modified polyphenylene ether compound and the curing agent are contents that satisfy the above ratio, a resin composition more excellent in heat resistance and flame retardancy of the cured product is obtained. It is considered that this is because the curing reaction between the modified polyphenylene ether compound and the curing agent suitably proceeds.

(Other Components)

The resin composition according to the present embodiment may contain components (other components) in addition to the modified polyphenylene ether compound and the crosslinking agent if necessary as long as the effects of the present invention are not impaired. As other components contained in the resin composition according to the present embodiment, for example, additives such as a silane coupling agent, a flame retardant, an initiator, an antifoaming agent, an antioxidant, a heat stabilizer, an antistatic agent, an ultraviolet absorber, a dye or pigment, a lubricant, and an inorganic filler may be further contained. The resin composition may contain thermosetting resins such as an epoxy resin, an unsaturated polyester resin, a thermosetting polyimide resin, a maleimide compound, and a modified maleimide compound in addition to the modified polyphenylene ether compound. Examples of the modified maleimide compound include a maleimide compound in which at least a part of the molecule is modified with a silicone compound and a maleimide compound in which at least a part of the molecule is modified with an amine compound.

As described above, the resin composition according to the present embodiment may contain a silane coupling agent. The silane coupling agent may be contained in the resin composition or may be contained as a silane coupling agent covered on the inorganic filler contained in the resin composition for surface treatment in advance. Among these, it is preferable that the silane coupling agent is contained as a silane coupling agent covered on the inorganic filler for surface treatment in advance, and it is more preferable that the silane coupling agent is contained as a silane coupling agent covered on the inorganic filler for surface treatment in advance and further is also contained in the resin composition. In the case of a prepreg, the silane coupling agent may be contained in the prepreg as a silane coupling agent covered on the fibrous base material for surface treatment in advance.

Examples of the silane coupling agent include a silane coupling agent having at least one functional group selected from the group consisting of a vinyl group, a styryl group, a methacryl group, an acryl group, and a phenylamino group. In other words, examples of this silane coupling agent include compounds having at least one of a vinyl group, a styryl group, a methacryl group, an acryl group, or a phenylamino group as a reactive functional group, and further a hydrolyzable group such as a methoxy group or an ethoxy group.

Examples of the silane coupling agent include vinyltriethoxysilane and vinyltrimethoxysilane as those having a vinyl group. Examples of the silane coupling agent include p-styryltrimethoxysilane and p-styryltriethoxysilane as those having a styryl group. Examples of the silane coupling agent include 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-methacryloxypropylethyldiethoxysilane as those having a methacryl group. Examples of the silane coupling agent include 3-acryloxypropyltrimethoxysilane and 3-aeryloxypropyltriethoxysilane as those having an acryl group. Examples of the silane coupling agent include N-phenyl-3-aminopropyltrimethoxysilane and N-phenyl-3-aminopropyltriethoxysilane as those having a phenylamino group.

As described above, the resin composition according to the present embodiment may contain a flame retardant. The flame retardancy of a cured product of the resin composition can be enhanced by containing a flame retardant. The flame retardant is not particularly limited. Specifically, in the field in which halogen-based flame retardants such as bromine-based flame retardants are used, for example, ethylenedipentabromobenzene, ethylenebistetrabromoimide, decabromodiphenyloxide, and tetradecabromodiphenoxybenzene which have a melting point of 300° C. or more are preferable. It is considered that the elimination of halogen at a high temperature and a decrease in heat resistance can be suppressed by the use of a halogen-based flame retardant. In the field of being required to be free of halogen, a phosphoric ester-based flame retardant, a phosphazene-based flame retardant, a bis(diphenylphosphine oxide)-based flame retardant, and a phosphinate-based flame retardant are exemplified. Specific examples of the phosphoric ester-based flame retardant include a condensed phosphoric ester such as dixylenyl phosphate. Specific examples of the phosphazene-based flame retardant include phenoxyphosphazene. Specific examples of the bis(diphenylphosphine oxide)-based flame retardant include xylylenebis(diphenylphosphine oxide). Specific examples of the phosphinate-based flame retardant include metal phosphinates such as aluminum dialkyl phosphinate. As the flame retardant, the flame retardants exemplified may be used singly or in combination of two or more kinds thereof.

As described above, the resin composition according to the present embodiment may contain an initiator (reaction initiator). The curing reaction can proceed even when the polyphenylene ether resin composition is composed of the maleimide compound, the modified polyphenylene ether compound, and the crosslinking agent. The curing reaction can proceed even when the polyphenylene ether resin composition is composed only of modified polyphenylene ether. However, a reaction initiator may be added since there is a case where it is difficult to raise the temperature until curing proceeds depending on the process conditions. The reaction initiator is not particularly limited as long as it can promote the curing reaction of the maleimide compound, the modified polyphenylene ether compound, and the crosslinking agent. Specific examples thereof include oxidizing agents such as α,α'-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. A metal carboxylate can be concurrently used if necessary. By doing so, the curing reaction can be further promoted. Among these, α,α'-bis(t-butylperoxy-m-isopropyl)benzene is preferably used. α,α'-bis(t-butylperoxy-m-isopropyl)benzene has a relatively high reaction initiation temperature and thus can suppress the promotion of the curing reaction at the time point at which curing is not required, for example, at the time of prepreg drying, and can suppress a decrease in the storage stability of the polyphenylene ether resin composition. α,α'-bis(t-butylperoxy-m-isopropyl)benzene exhibits low volatility, thus does not volatilize at the time of prepreg drying and storage, and exhibits favorable stability. The reaction initiators may be used singly or in combination of two or more kinds thereof.

As described above, the resin composition according to the present embodiment may contain a filler such as an inorganic filler. Examples of the filler include those to be added to enhance the heat resistance and flame retardancy of a cured product of the resin composition, but the filler is not particularly limited. The heat resistance, flame retardancy and the like can be further enhanced by containing a filler. Specific examples of the filler include silica such as spherical silica, metal oxides such as alumina, titanium oxide, and mica, metal hydroxides such as aluminum hydroxide and magnesium hydroxide, talc, aluminum borate, barium sulfate, and calcium carbonate. As the filler, silica, mica, and talc are preferable and spherical silica is more preferable among these. The filler may be used singly or in combination of two or more kinds thereof. The filler may be used as it is, or a filler subjected to a surface treatment with the silane coupling agent may be used.

When a filler is contained, the content thereof (filler content) is preferably 30 to 270% by mass, more preferably 50 to 250% by mass with respect to the resin composition.

(Copper Foil)

The copper foil is not particularly limited as long as it is a copper foil in which the exposed surface becomes as described above when the copper-clad laminate is etched with a copper chloride solution. Specifically, the copper foil is not particularly limited as long as it is a copper foil in which the chromium element amount on the exposed surface measured by XPS is 7.5 at % or less with respect to the total element amount measured by XPS and the surface roughness of the exposed surface is 2.0 μm or less in terms of ten-point average roughness. The etching treatment of the copper-clad laminate when the exposed surface is formed is an etching treatment using a copper chloride solution and is a treatment for removing the copper foil. Specifically, the etching treatment is a treatment for removing the copper foil by performing etching using a cupric chloride solution at a temperature of this solution of 45° C. for 90 seconds (for example, in a case where the thickness of the copper foil is 18 μm) and then performing water washing using city water or pure water at room temperature.

The chromium element amount on the exposed surface measured by XPS is 7.5 at % or less as described above, preferably 7.0 at % or less, more preferably 6.5 at % or less with respect to the total element amount measured by XPS. When this chromium element amount is too large, the interlayer adhesive property decreases, delamination is likely to occur when the obtained copper-clad laminate is heated, and the heat resistance tends to decrease. For this reason, it is more preferable as the chromium element amount is smaller, but the limit thereof is about 0.1 at % in reality. From this fact, the chromium element amount is preferably 0.1 to 7.5 at %.

The chromium element amount can be measured by general X-ray photoelectron spectroscopy as XPS. Specifically, the chromium element amount can be measured by irradiating the sample with X-rays in a vacuum using PHI 5000 Versaprobe manufactured by ULVAC-PHI, INCORPORATED.

It is preferable that a nitrogen element that can be confirmed by XPS exists on the exposed surface. The term "nitrogen element that can be confirmed by XPS" means that the nitrogen element amount is an amount equal to or more than the detection limit by XPS, specifically, 0.1 at % or more. The nitrogen element amount on the exposed surface measured by XPS is preferably 1.0 at % or more, more preferably 2.5 at % or more, still more preferably 3.5 at % or more with respect to the total element amount measured by XPS.

The present inventors have found out that delamination is less likely to occur even when the obtained wiring board is heated when a nitrogen element that can be confirmed by XPS exists on the exposed surface. The present inventors have presumed that delamination is likely to occur at the time of heating when a compound containing a chromium element exists as an etching residue as described above. On the other hand, when a compound containing a nitrogen element as an etching residue exists in an amount that can be confirmed by X-ray photoelectron spectroscopy, it is considered that the compound containing a nitrogen element also exists in a certain amount or more on the surface of the insulating layer existing between the wirings in a wiring board manufactured from the copper-clad laminate. It is considered that the interlayer adhesive property between the insulating layers is enhanced and delamination is less likely to occur by this compound containing a nitrogen element. From this fact, it is considered that a copper-clad laminate is obtained from which a wiring board exhibiting higher heat resistance can be suitably manufactured. From this fact, when the nitrogen element amount is too small, there is a tendency that the effect of suppressing the occurrence of delamination by the existence of nitrogen element cannot be sufficiently exerted. It is more preferable as the nitrogen element amount is larger, but the limit thereof is about 5.0 at % in reality. From this fact, the nitrogen element amount is preferably 1.0 to 5.0 at %.

The nitrogen element is preferably derived from a nitrogen atom contained in a compound having an amino group and is more preferably derived from a nitrogen atom contained in a silane coupling agent having an amino group. The fact that the nitrogen element is derived from the nitrogen atom contained in a compound having an amino group is considered to mean that a compound containing a nitrogen element which exists as an etching residue is a compound having an amino group. Specifically, such a copper foil is considered to be a copper foil having a layer treated with a silane coupling agent having an amino group in the molecule as a silane coupling agent layer described later. It is considered that this compound having an amino group, namely, a silane coupling agent having an amino group in the molecule more effectively exerts the effect of enhancing the interlayer adhesive property between the insulating layers and diminishing the occurrence of delamination. From this fact, it is considered that a copper-clad laminate is obtained from which a wiring board exhibiting higher heat resistance can be suitably manufactured.

One or more selected from a copper (Cu) element, a carbon (C) element, an oxygen (O) element, a silicon (Si) element, a nickel (Ni) element, a zinc (Zn) element, a cobalt (Co) element or the like may exist on the exposed surface as elements that can be confirmed by XPS, in addition to a chromium (Cr) element and a nitrogen (N) element. The amount of each of these elements is, for example, preferably 0 to 90 at %, more preferably 0 to 80 at %, still more preferably 0 to 70 at % with respect to the total element amount measured by XPS.

Specific examples of the copper foil include copper foil obtained by subjecting a copper foil base material to various treatments. The treatment is not particularly limited as long as it is a treatment applied to a copper foil used in a copper-clad laminate. Examples of the treatment include a roughening treatment, a heat resistance treatment, a rust prevention treatment, and a silane coupling agent treatment. The copper foil may be one that has been subjected to any one treatment or one that has been subjected to the combination of two or more treatments. In a case where two or more of the treatments are performed, it is preferable to perform the roughening treatment, the heat resistance treatment, the rust prevention treatment, and the silane coupling agent treatment in this order.

The copper foil base material may contain copper, and examples thereof include a foil-like base material formed of copper or a copper alloy. Examples of the copper alloy include alloys containing copper and at least one selected from the group consisting of nickel, phosphorus, tungsten, arsenic, molybdenum, chromium, cobalt, and zinc.

The roughening treatment is not particularly limited and may be a roughening treatment generally performed when a copper foil is manufactured, but examples thereof include a treatment for forming roughening particles on the surface of the copper foil base material or the like that is an object to be treated. By this roughening treatment, the surface of the copper foil is covered with roughening particles formed of copper or a copper alloy. The region composed of these roughening particles is also called a roughened layer. The copper foil may have a layer (roughened layer) formed by the roughening treatment.

The heat resistance treatment is not particularly limited and may be a heat resistance treatment generally performed when a copper foil is manufactured, but examples thereof include a treatment for forming a heat resistant layer containing a simple substance or an alloy of nickel, cobalt, copper, or zinc. The region formed by this heat resistance treatment is also called a heat resistant layer even if the region does not have a complete layer shape. The copper foil may have a layer (heat resistant layer) formed by the heat resistance treatment.

The rust prevention treatment is not particularly limited, and may be a rust prevention treatment generally performed when a copper foil is manufactured, but is preferably a treatment for forming a rust preventive layer containing nickel. Examples of the rust prevention treatment include a chromate treatment. The region formed by this rust prevention treatment is also called a rust preventive layer even if the region does not have a complete layer shape. The copper foil may have a layer (rust preventive layer) formed by the rust prevention treatment.

The silane coupling agent treatment is not particularly limited and may be a silane coupling agent treatment generally performed when a copper foil is manufactured, but examples thereof include a treatment for applying a silane coupling agent to the surface of the copper foil or the like that is an object to be treated. As the silane coupling agent treatment, the silane coupling agent may be dried or heated after being applied. By treating the copper foil with a silane coupling agent, the alkoxy group of the silane coupling agent reacts and bonds with copper or the like constituting the copper foil that is an object to be treated. The region formed by this bonded silane coupling agent is a silane coupling agent layer. The copper foil may have a layer (silane coupling agent layer) formed by the silane coupling agent treatment.

Specific examples of the copper foil include a copper foil including a copper foil base material and a coating layer disposed on the copper foil base material. Examples of the coating layer include a roughened layer, a heat resistant layer, a rust preventive layer, and a silane coupling agent layer. In the copper foil, these layers may be provided singly or two or more of these layers may be provided by being laminated as the coating layer. In a case where the coating layer is formed of a plurality of layers, it is preferable to provide the copper foil base material, the roughened layer, the heat resistant layer, the rust preventive layer, and the silane coupling agent layer in this order.

Examples of the roughened layer include a layer containing roughening particles formed of copper or a copper alloy. The copper alloy is the same as the copper alloy in the copper foil base material. The roughened layer is obtained by, for example, subjecting the copper foil base material to a roughening treatment. Examples of the roughened layer include a layer in which roughening particles obtained by subjecting the copper foil base material to a roughening treatment are formed and then particles formed of simple substances or alloys of nickel, cobalt, copper, zinc and the like are formed as secondary particles and tertiary particles. In other words, the roughened layer includes a layer which contains not only the roughening particles but also particles formed of simple substances or alloys of nickel, cobalt, copper, zinc and the like.

Examples of the heat resistant layer include layers containing simple substances or alloys of nickel, cobalt, copper, zinc and the like. The heat resistant layer may be a single layer or two or more layers. Examples of the heat resistant layer include a layer in which a nickel layer and a zinc layer are laminated.

Examples of the rust preventive layer include a layer containing chromium such as a chromate treated layer. The rust preventive layer is obtained by, for example, subjecting a copper foil base material provided with the heat resistant layer and the like to chromate treatment.

The silane coupling agent layer is a layer obtained by performing a treatment with a silane coupling agent. Examples thereof include a layer obtained by treating a copper foil base material provided with the rust preventive layer and the like with a silane coupling agent.

Examples of the silane coupling agent include a silane coupling agent having an amino group in the molecule and a silane coupling agent having a carbon-carbon unsaturated double bond in the molecule.

Examples of the silane coupling agent having an amino group in the molecule include compounds having an amino group as a reactive functional group, and further a hydrolyzable group such as a methoxy group or an ethoxy group. Specific examples of the silane coupling agent having an amino group in the molecule include N-(2-aminoethyl)-3-aminopropylmethyldimethoxysilane, N-(2-aminoethyl)-3-aminopropylmethyldiethoxysilane, 1-aminopropyltrimethoxysilane, 2-aminopropyltrimethoxysilane, 3-aminopropyltrimethoxysilane, 1,2-diaminopropyltrimethoxysilane, 3-amino-1-propenyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane, 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, 3-(N-phenyl)aminopropyltrimethoxysilane, N-(2-aminoethyl)-3-aminopropylethyldiethoxysilane, N-(2-aminoethyl)-3-aminopropyltriethoxysilane, 3-(N-styrylmethyl-2-aminoethylamino)propyltrimethoxysilane, bis(2-hydroxyethyl)-3-aminopropyltriethoxysilane, N-methylaminopropyltrimethoxysilane, N-(3-acryloxy-2-hydroxypropyl)-3-aminopropyltriethoxysilane, 4-aminobutyltriethoxysilane, (aminoethylaminomethyl)phenetyltrimethoxysilane, N-(2-aminoethyl-3-aminopropyl)tris(2-ethylhexoxy)silane, 6-(aminohexylaminopropyl)trimethoxysilane, aminophenyltrimethoxysilane, 3-(1-aminopropoxy)-3,3-dimethyl-1-propenyltrimethoxysilane, 3-aminopropyltris(methoxyethoxyethoxy)silane, 3-aminopropyltriethoxysilane, 3-aminopropyltrimethoxysilane, co-aminoundecyltrimethoxysilane, 3-(2-N-benzylaminoethyl-aminopropyl)trimethoxysilane, bis(2-hydroxyethyl)-3-aminopropyltrimethoxysilane, (N,N-diethyl-3-aminopropyl)trimethoxysilane, (N,N-dimethyl-3-aminopropyl)trimethoxysilane, N-methylaminopropyltrimethoxysilane, N-phenylaminopropyltriethoxysilane, and 3-(N-styrylmethyl-2-aminoethyl-amino)propyltriethoxysilane.

Specific examples of the silane coupling agent having a carbon-carbon unsaturated double bond in the molecule include a silane coupling agent having at least one functional group selected from the group consisting of a methacryloxy group, a styryl group, a vinyl group, and an acryloxy group. In other words, examples of this silane coupling agent include compounds having at least one of a methacryloxy group, a styryl group, a vinyl group, or an acryloxy group as a reactive functional group, and further a hydrolyzable group such as a methoxy group or an ethoxy group. Examples of the silane coupling agent having a carbon-carbon unsaturated double bond in the molecule include the following silane coupling agents. Examples of a silane coupling agent having a methacryloxy group in the molecule include 3-methacryloxypropyltrimethoxysilane, 3-methacryloxy-propylmethyldimethoxysilane, 3-methacryloxypropyltriethoxysilane, 3-methacryloxypropylmethyldiethoxysilane, and 3-methacryloxypropylethyldiethoxysilane. Examples of a silane coupling agent having a styryl group in the molecule include p-styryltrimethoxysilane and p-styryltriethoxysilane. Examples of a silane coupling agent having a vinyl group in the molecule include vinyltriethoxysilane and vinyltrimethoxysilane. Examples of a silane coupling agent having an acryloxy group in the molecule include 3-acryloxypropyltrimethoxysilane and 3-acryloxypropyltriethoxysilane.

The chromium element amount can be adjusted, for example, by adjusting the thickness and the like of the layer containing chromium such as a chromate layer in the coating layer.

The nitrogen element can be allowed to exist by forming a layer using a silane coupling agent having an amino group in the molecule as a silane coupling agent layer. The amount of nitrogen element (nitrogen element amount) can be adjusted by adjusting the thickness and the like of the layer obtained using a silane coupling agent having an amino group in the molecule as a silane coupling agent layer.

The average roughness of the exposed surface is 2.0 μm or less, preferably 1.8 μm or less, more preferably 1.5 μm or less in terms of ten-point average roughness. It is considered that as the surface roughness of the exposed surface is lower, that is, as the smoothness of the exposed surface is higher, the smoothness of the contact surface between the copper foil and the insulating layer is also higher, and this is preferable from the viewpoint of being able to diminish the loss at the time of signal transmission. On the other hand, the limit of the surface roughness of the exposed surface is about 0.2 μm in terms of ten-point average roughness Rz even if the surface roughness of the exposed surface is decreased. When the surface roughness of the exposed surface is too low, it is considered that the smoothness of the contact surface between the copper foil and the insulating layer is too high, and the adhesiveness between the copper foil and the insulating layer tends to decrease. From this point as well, the surface roughness of the exposed surface is preferably 0.2 μm or more in terms of ten-point average roughness Rz. Hence, the surface roughness of the exposed surface is preferably 0.2 to 2.0 μm, more preferably 0.5 to 2.0 μm, still more preferably 0.6 to 1.8 μm, most preferably 0.6 to 1.5 μm in terms of the ten-point average roughness Rz.

The ten-point average roughness Rz that is the surface roughness here conforms to JIS B 0601: 1994 and can be measured using a general surface roughness measuring instrument or the like. Specifically, the ten-point average roughness Rz can be measured using, for example, a surface roughness and shape measuring instrument (SURFCOM 500DX) manufactured by TOKYO SEIMITSU CO., LTD.

The average roughness of the exposed surface can be adjusted by adjusting the average roughness of the surface of the copper foil on the side in contact with the insulating layer. Specifically, the average roughness of the surface of the copper foil on the side in contact with the insulating layer is preferably 0.5 to 2.0 μm in terms of ten-point average roughness Rz. The surface of the copper foil having a large average roughness, the so-called M surface, is the surface on the side in contact with the insulating layer. It is only required that the coating layer as described above is formed on the M surface side. On the surface of the copper foil having a small average roughness, the so-called S surface, a coating layer as described above may be formed similarly to the M surface, but only the rust preventive layer may be formed or the coating layer may not be formed.

(Production Method)

The resin composition used in the present embodiment may be prepared in the form of a varnish and used. For example, when a prepreg is manufactured, the resin composition may be prepared in the form of a varnish and used for the purpose of impregnating the base material (fibrous base material) for forming the prepreg with the resin composition. In other words, the resin composition may be used as one (resin varnish) prepared in the form of a varnish. In the resin composition used in the present embodiment, the modified polyphenylene ether compound and the curing agent are dissolved in a resin varnish. Such a varnish-like composition (resin varnish) is prepared, for example, as follows.

First, the components which can be dissolved in an organic solvent are introduced into and dissolved in an organic solvent. At this time, heating may be performed if necessary. Thereafter, components which are used if necessary but are not dissolved in the organic solvent are added to and dispersed in the solution until a predetermined dispersion state is achieved using a ball mill, a bead mill, a planetary mixer, a roll mill or the like, whereby a varnish-like composition is prepared. The organic solvent used here is not particularly limited as long as it dissolves the modified polyphenylene ether compound and the curing agent and does not inhibit the curing reaction. Specific examples thereof include toluene and methyl ethyl ketone (MEK).

As described above, the insulating layer may contain not only a cured product of the resin composition but also a fibrous base material. Examples of this fibrous base material include those similar to the fibrous base material contained in the prepreg to be described later.

By using the resin composition, not only the copper-clad laminate but also a prepreg, a copper foil with resin, and a wiring board can be obtained as follows. At this time, the varnish-like composition as described above may be used as the resin composition.

Figure 2:
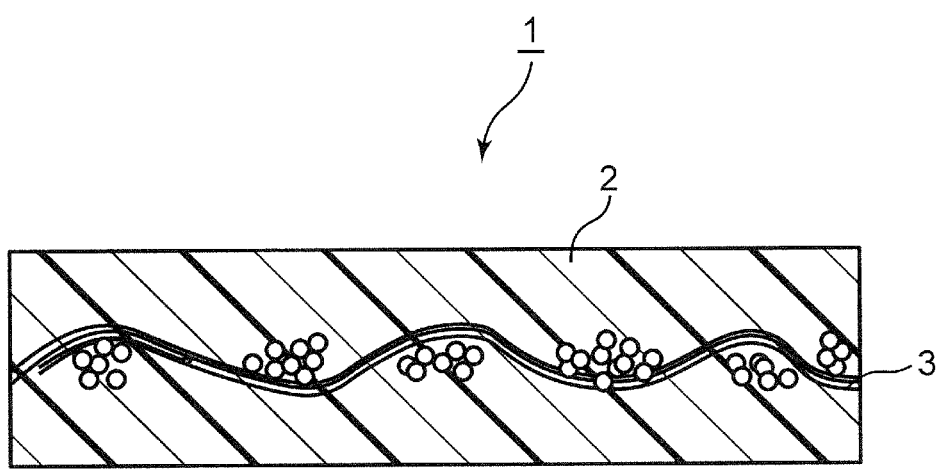
FIG. 2 is a schematic sectional view illustrating an example of a prepreg according to the embodiment of the present invention.

As illustrated in FIG. 2, the prepreg 1 includes the resin composition or a semi-cured product 2 of the resin composition and a fibrous base material 3. Examples of this prepreg 1 include those in which the fibrous base material 3 exists in the resin composition or the semi-cured product 2 of the resin composition. In other words, this prepreg 1 includes the resin composition or the semi-cured product 2 of the resin composition and the fibrous base material 3 existing in the resin composition or the semi-cured product 2 of the resin composition. FIG. 2 is a schematic sectional view illustrating an example of the prepreg 1 according to the present embodiment.

In the present embodiment, the semi-cured product is in a state in which the resin composition has been cured to an extent so that the resin composition can be further cured. In other words, the semi-cured product is in a state in which the resin composition has been semi-cured (B-staged). For example, when the resin composition is heated, the viscosity gradually decreases at first, and then curing starts, and the viscosity gradually increases. In such a case, the semi-cured state includes a state in which the viscosity has started to increase but curing is not completed, and the like.

The prepreg may contain a semi-cured product of the resin composition as described above or may contain the uncured resin composition itself. In other words, the prepreg may be a prepreg including a semi-cured product of the resin composition (the B-stage resin composition) and a fibrous base material or a prepreg including the resin composition before being cured (the A-stage resin composition) and a fibrous base material. Specific examples of the prepreg include those in which a fibrous base material exists in the resin composition. The resin composition or the semi-cured product of the resin composition may be one obtained by subjecting the resin composition to at least one of drying and heating.

The method of manufacturing the prepreg is not particularly limited as long as it is a method capable of manufacturing the prepreg. Examples of the method of manufacturing the prepreg include a method in which the fibrous base material is impregnated with the resin composition, for example, the resin composition prepared in the form of a varnish. In other words, examples of the prepreg include those obtained by impregnating a fibrous base material with the resin composition. The impregnation method is not particularly limited as long as it is a method capable of impregnating the fibrous base material with the resin composition. The impregnation method is not limited to dipping, and examples thereof include methods using rolls, die coats, and bar coats and spraying. As a method of manufacturing the prepreg, after the impregnation, the fibrous base material impregnated with the resin composition may be subjected to at least one of drying and heating. In other words, examples of the method of manufacturing the prepreg include a method in which a fibrous base material is impregnated with a resin composition prepared in the form of a varnish and then dried, a method in which a fibrous base material is impregnated with a resin composition prepared in the form of a varnish and then heated, and a method in which a fibrous base material is impregnated with a resin composition prepared in the form of a varnish, dried, and then heated.

Specific examples of the fibrous base material used in the manufacture of prepreg include glass cloth, aramid cloth, polyester cloth, liquid crystal plastic (TCP) non-woven fabric, glass non-woven fabric, aramid non-woven fabric, polyester non-woven fabric, pulp paper, and linter paper. When glass cloth is used, a laminate exhibiting excellent mechanical strength is obtained, and glass cloth subjected to flattening is particularly preferable. The glass cloth is not particularly limited, and examples thereof include a glass cloth formed of low dielectric constant glass such as E glass, S glass, NE glass, L glass, and Q glass. Specifically, the flattening can be performed by, for example, continuously pressing the glass cloth at an appropriate pressure using a press roll to flatly compress the yarn. As the thickness of the fibrous base material, for example, one having a thickness of 0.01 to 0.3 mm can be generally used.

The impregnation of the fibrous base material with the resin composition (resin varnish) is performed by immersion, coating and the like. If necessary, it is possible to repeat this impregnation a plurality of times. At this time, it is also possible to finally adjust the composition and impregnated amount to the desired composition and impregnated amount by repeating the impregnation using a plurality of resin compositions having different compositions and concentrations.

The fibrous base material impregnated with the resin composition (resin varnish) is heated under desired heating conditions, for example, at 80° C. to 180° C. for 1 to 10 minutes. By heating, the solvent is volatilized from the resin varnish and the solvent is decreased or removed to obtain a prepreg before being cured (A stage) or in a semi-cured state (B stage).

The method of manufacturing the copper-clad laminate according to the present embodiment is not particularly limited as long as the copper-clad laminate can be manufactured. As the method of manufacturing the copper-clad laminate, for example, a copper-clad laminate can be obtained in the same manner as a general method of manufacturing a copper-clad laminate except that the resin composition and the copper foil are used. Examples thereof include a method in which the prepreg is used. Examples of a method of fabricating a copper-clad laminate using a prepreg include a method in which one sheet or a plurality of sheets of prepreg are stacked, the copper foil is further stacked on both or one of upper and lower surfaces of the prepregs so that the copper foils and the prepregs come into contact with each other, and the stacked copper foils and prepregs are heat-press molded to be laminated and integrated. In other words, the method of manufacturing the copper-clad laminate includes a step of obtaining the resin composition, a step of impregnating a fibrous base material with the resin composition to obtain a prepreg, and a step of stacking the copper foil on the prepreg and heat-press molding the stacked copper foils and prepregs to obtain a copper-clad laminate including an insulating layer containing a cured product of the resin composition and a copper foil in contact with at least one surface of the insulating layer. By this method, a copper-clad laminate including a copper foil on both surfaces or a copper-clad laminate including a copper foil on one surface can be fabricated. The heating and pressing conditions can be appropriately set depending on the thickness of the laminate to be manufactured, the kind of the resin composition contained in the prepreg, and the like. For example, it is possible to set the temperature to 170° C. to 210° C., the pressure to 3.5 to 4 MPa, and the time to 60 to 150 minutes.

The copper-clad laminate may be manufactured without using a prepreg. Examples of the method include a method in which a varnish-like resin composition or the like is applied onto the copper foil to form a layer containing a curable composition on the copper foil and then heating and pressing is performed.

[Wiring Board]

Figure 3:
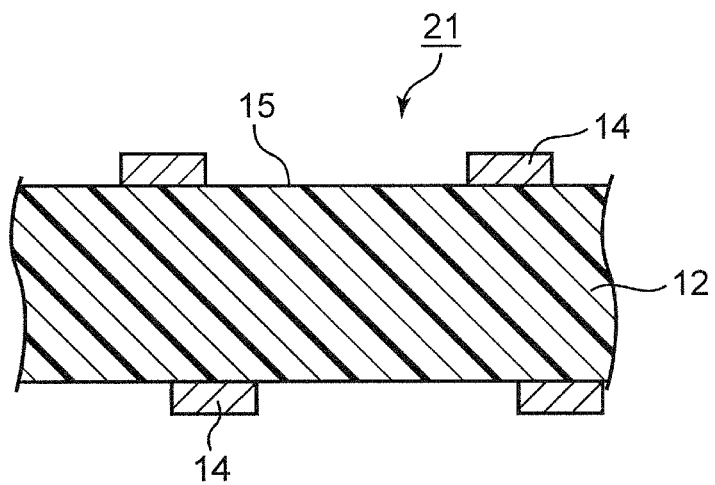
FIG. 3 is a schematic sectional view illustrating an example of a wiring board according to the embodiment of the present invention.

The wiring board according to another embodiment of the present invention includes wiring formed by partially removing the copper foil provided in the copper-clad laminate and the insulating layer. In other words, as illustrated in FIG. 3, this wiring board 21 includes the insulating layer 12 and wiring 14, formed by partially removing the copper foil provided in the copper-clad laminate, on both surfaces of the insulating layer 12. The wiring board may be provided with wiring in contact with only one surface of the insulating layer. FIG. 3 is a sectional view illustrating the configuration of the wiring board 21 according to the present embodiment.

The wiring board 21 includes an insulating layer 12 and wiring 14 that exists to be in contact with at least one surface of the insulating layer 12. Examples of the wiring board 21 include a wiring board in which a surface 15 of the insulating layer 12 existing between the wirings 14 is a surface as described below similarly to the exposed surface. The chromium element amount on the surface 15 measured by XPS is 7.5 at % or less with respect to the total element amount measured by XPS. The surface roughness of the surface 15 is 2.0 μm or less in terms of ten-point average roughness. It is considered that the etching residue remains on the surface 15 corresponding to this exposed surface, but the insulating layer 12 includes the surface 15 corresponding to this exposed surface.

Examples of the insulating layer 12 include a layer similar to the insulating layer of the copper-clad laminate. Examples of the wiring 14 include wiring formed by partially removing the copper foil of the copper-clad laminate. Examples of such wiring include wiring formed by a method using subtractive, additive, semi additive process (SAP), modified semi additive process (MSAP), chemical mechanical polishing (CMP), trenching, inkjetting, squeegeeing, transfer, or the like.

This copper-clad laminate has a high signal transmission speed and high heat resistance. It is considered that this is because the wiring board is obtained using the copper-clad laminate. Specifically, as described above, it is considered that this is because the occurrence of delamination can be sufficiently suppressed since the amount of the compound containing a chromium element which exists between the wirings is small. It is considered that the signal transmission speed is high because the insulating layer has a low dielectric constant and a low dielectric loss tangent and the smoothness of the contact surface between the wiring and the insulating property is high as described above.

Figure 4:
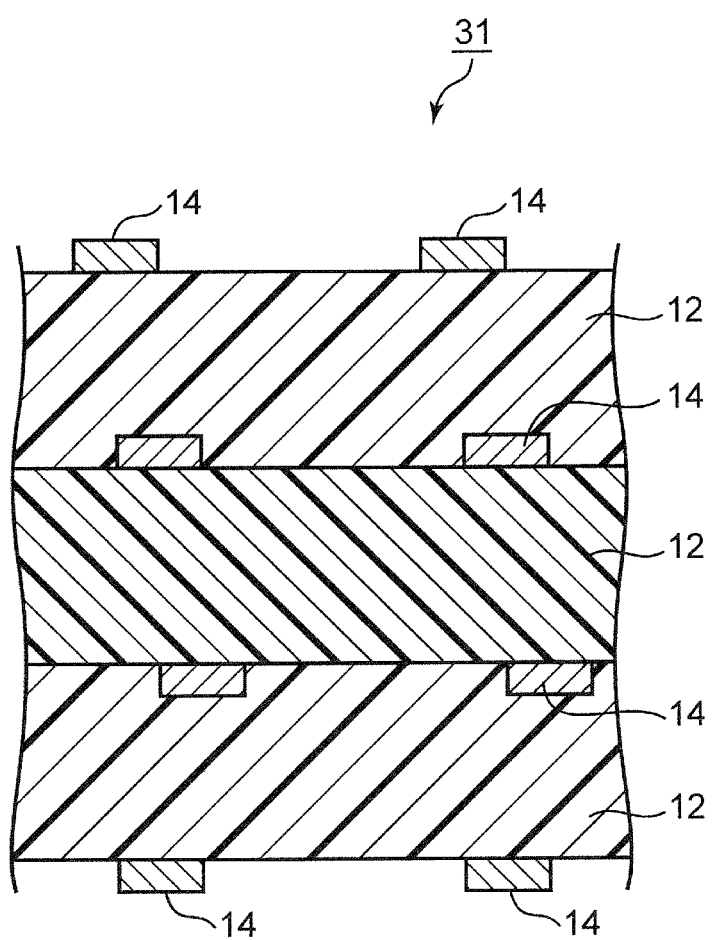
FIG. 4 is a schematic sectional view illustrating another example of a wiring board according to the embodiment of the present invention.

The wiring board according to the present embodiment may have one insulating layer as illustrated in FIG. 3 or may have a plurality of insulating layers as illustrated in FIG. 4. In the case of having a plurality of the insulating layers, the wiring may be disposed on the surfaces of the plurality of the insulating layers as illustrated in FIG. 4 or may be disposed between the insulating layers. As illustrated in FIG. 4, a wiring board 31 according to the present embodiment has a plurality of the insulating layers 12. In the wiring board 31, the wiring 14 is disposed between the insulating layers 12. FIG. 4 is a schematic sectional view illustrating another example of the wiring board 31 according to an embodiment of the present invention.

The wiring board as illustrated in FIG. 4 is manufactured as follows, for example. The prepreg is stacked on at least one surface of a wiring board as illustrated in FIG. 3 and, if necessary, a copper foil is stacked on the prepreg, and heat-press molding is performed. The copper foil on the surface of the laminate thus obtained is subjected to etching and the like to form wiring. A multilayer wiring board as illustrated in FIG. 4 can be thus manufactured.

Such a wiring board is a multilayer wiring board having a high signal transmission speed and high heat resistance. Specifically, the wiring board is a multilayer wiring board, exhibits high heat resistance, and is unlikely to cause delamination even when being heated, and it is possible to suppress the occurrence of delamination between the insulating layers even when the wiring is disposed between the insulating layers.

[Copper Foil with Resin]

Figure 5:
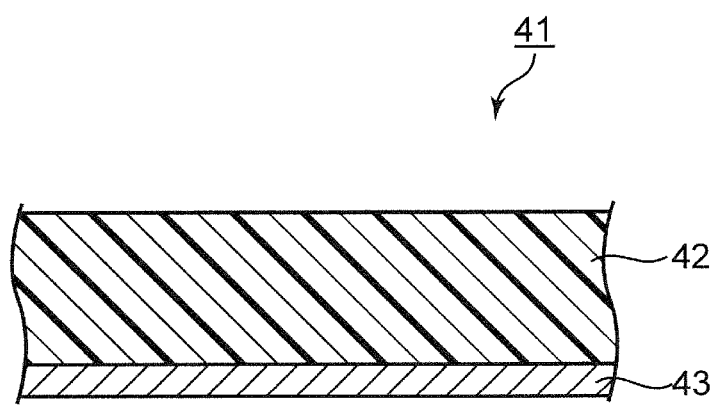
FIG. 5 is a schematic sectional view illustrating an example of a copper foil with resin according to the embodiment of the present invention.

The copper foil with resin according to another embodiment of the present invention includes a resin layer and a copper foil in contact with one surface of the resin layer. As illustrated in FIG. 5, this copper foil with resin 41 includes a resin layer 42 and a copper foil 43 disposed so as to be in contact with one surface of the resin layer 42. FIG. 5 is a sectional view illustrating the configuration of the copper foil with resin 41 according to the present embodiment.

The resin layer 42 contains the resin composition (the resin composition in A stage) as described above or a semi-cured product of the resin composition (the resin composition in B stage). The resin layer is only required to contain the resin composition or a semi-cured product of the resin composition and may or may not contain a fibrous base material. As the fibrous base material, those similar to the fibrous base materials of the prepreg can be used. The copper foil 43 is similar to the copper foil provided in the copper-clad laminate. The chromium element amount on the exposed surface, on which the resin layer is exposed after the copper foil with resin in which the resin layer has been cured is etched with a copper chloride solution, measured by X-ray photoelectron spectroscopy is 7.5 at % or less with respect to the total element amount measured by X-ray photoelectron spectroscopy, and the surface roughness of the exposed surface is 2.0 μm or less in terms of ten-point average roughness.

From such a copper foil with resin, a wiring board having a higher signal transmission speed and higher heat resistance can be suitably manufactured.

The method of manufacturing the copper foil with resin according to the present embodiment is not particularly limited as long as it is a method capable of manufacturing the copper foil with resin. As the method of manufacturing the copper foil with resin, for example, a copper foil with resin can be obtained in the same manner as a general method of manufacturing a copper foil with resin except that the resin composition and the copper foil are used. Examples of the method of manufacturing the copper foil with resin include a method in which the resin composition, for example, a resin composition prepared in the form of a varnish is applied onto the copper foil. In other words, examples of the copper foil with resin according to the embodiments of the present invention include those obtained by applying the resin composition onto the copper foil. The application method is not particularly limited as long as it is a method capable of applying the resin composition onto the copper foil. Examples thereof include methods using rolls, die coats, and bar coats, and spraying. As the method of manufacturing the copper foil with resin, the copper foil coated with the resin composition may be subjected to at least one of drying and heating after the application. In other words, examples of the method of manufacturing the copper foil with resin include a method in which a resin composition prepared in the form of a varnish is applied onto a copper foil and then dried, a method in which a resin composition prepared in the form of a varnish is applied onto a copper foil and then heated, and a method in which a resin composition prepared in the form of a varnish is applied onto a copper foil, dried, and then heated. The copper foil coated with the resin composition is heated under desired heating conditions, for example, at 80° C. to 180° C. for 1 to 10 minutes to obtain a copper foil with resin before being cured (A stage) or in a semi-cured state (B stage).

The present specification discloses various aspects of a technique as described above, but the main technique is summarized below.

A copper-clad laminate according to an aspect of the present invention is a copper-clad laminate including an insulating layer and a copper foil in contact with at least one surface of the insulating layer, in which the insulating layer contains a cured product of a resin composition containing a modified polyphenylene ether compound of which a terminal is modified with a substituent having a carbon-carbon unsaturated double bond, a chromium element amount on an exposed surface, on which the insulating layer is exposed by an etching treatment of the copper-clad laminate with a copper chloride solution, measured by X-ray photoelectron spectroscopy is 7.5 at % or less with respect to a total element amount measured by X-ray photoelectron spectroscopy, and a surface roughness of the exposed surface is 2.0 μm or less in terms of ten-point average roughness.

According to such a configuration, it is possible to provide a copper-clad laminate from which a wiring board having a high signal transmission speed and high heat resistance can be suitably manufactured.

This is considered to be due to the following.

It is first considered that the heat resistance of the insulating layer can be enhanced since the cured product contained in the insulating layer is a cured product obtained by curing a resin composition containing the modified polyphenylene ether compound.

As described above, the present inventors have found out that the delamination that occurs between the insulating layer between wirings and another insulating layer when another insulating layer is formed on the surface of the insulating layer existing between wirings is affected by the copper foil that originally has existed even though a copper foil does not exist between the insulating layers in a wiring board manufactured from a copper-clad laminate. From this fact, it is considered that the etching residue derived from the copper foil exists on the exposed surface on which the insulating layer is exposed by an etching treatment. The present inventors have presumed that delamination is likely to occur at the time of heating when a compound containing a chromium element exists as this etching residue. It is considered that the amount of chromium element also existing on the surface of the insulating layer existing between the wirings in a wiring board manufactured from the copper-clad laminate, namely, the amount of a compound containing a chromium element is small when the amount of chromium element existing on the exposed surface is small as described above. From this fact, it is considered that the copper-clad laminate exhibits high heat resistance so that delamination can be sufficiently suppressed even when heating is performed.

The dielectric constant and the dielectric loss tangent are low since the cured product contained in the insulating layer is a cured product obtained by curing a resin composition containing the modified polyphenylene ether compound. From this fact, it is considered that it is possible to diminish the transmission loss caused by the dielectric around the wiring and increase the signal transmission speed in this wiring board.

It is considered that the smoothness of the contact surface between the copper foil and the insulating layer is also high since the surface roughness of the exposed surface is low. From this fact, it is considered that the smoothness of the contact surface between the wiring and the insulating layer is also high in a wiring board obtained from the copper-clad laminate. It is considered that the signal for transmitting the wiring is concentrated near the surface of the conductor constituting the wiring by the skin effect. It is considered that this effect is more remarkable as the signal for transmitting the wiring has a higher frequency. As the contact surface between the wiring and the insulating layer is smooth, the signal flowing through the wiring flows near the surface having high smoothness and the transmission distance is shorter. From this fact, it is considered that it is possible to diminish the transmission loss caused by the conductor forming the wiring and increase the signal transmission speed in this wiring board.

From this fact, it is considered that it is possible to diminish the transmission loss caused by the conductor forming the wiring and the transmission loss caused by the dielectric around the wiring and increase the signal transmission speed in this wiring board.

From the above, it is considered that the copper-clad laminate is a copper-clad laminate from which a wiring board having a high signal transmission speed and high heat resistance can be suitably manufactured.

In the copper-clad laminate, it is preferable that the substituent is a group represented by Formula (1) or Formula (2).

According to such a configuration, it is possible to provide a copper-clad laminate from which a wiring board having a higher signal transmission speed and higher heat resistance can be suitably manufactured.

This is considered to be due to the following.

It is considered that this is because the modified polyphenylene ether can maintain the low dielectric constant and low dielectric loss tangent of polyphenylene ether and can further enhance the curability. For this reason, it is considered that the insulating layer containing a cured product of the modified polyphenylene ether is a layer having a low dielectric constant, a low dielectric loss tangent, and high heat resistance. From these facts, it is considered that a copper-clad laminate is obtained from which a wiring board having a higher signal transmission speed and higher heat resistance can be suitably manufactured.

In the copper-clad laminate, it is preferable that a nitrogen element that can be confirmed by X-ray photoelectron spectroscopy exists on the exposed surface.

According to such a configuration, it is possible to provide a copper-clad laminate from which a wiring board exhibiting higher heat resistance can be suitably manufactured.

This is considered to be due to the following.

The present inventors have first found out that delamination is less likely to occur even when heating is performed when a nitrogen element that can be confirmed by X-ray photoelectron spectroscopy exists on the exposed surface. The present inventors have presumed that delamination is likely to occur at the time of heating when a compound containing a chromium element exists as an etching residue as described above. On the other hand, when a compound containing a nitrogen element as an etching residue exists in an amount that can be confirmed by X-ray photoelectron spectroscopy, it is considered that the compound containing a nitrogen element also exists in a certain amount or more on the surface of the insulating layer existing between the wirings in a wiring board manufactured from the copper-clad laminate. It is considered that the interlayer adhesive property between the insulating layers is enhanced and delamination is less likely to occur by this compound containing a nitrogen element. From this fact, it is considered that a copper-clad laminate is obtained from which a wiring board exhibiting higher heat resistance can be suitably manufactured.

In the copper-clad laminate, it is preferable that the nitrogen element amount on the exposed surface measured by X-ray photoelectron spectroscopy is 1.0 at % or more with respect to the total element amount measured by X-ray photoelectron spectroscopy.

According to such a configuration, it is possible to provide a copper-clad laminate from which a wiring board exhibiting higher heat resistance can be suitably manufactured.

It is considered that this is because the interlayer adhesive property between the insulating layers is enhanced and delamination is less likely to occur by the above effects of the compound containing a nitrogen element which exists as an etching residue.

In the copper-clad laminate, it is preferable that the nitrogen element is derived from a nitrogen atom contained in a compound having an amino group.

According to such a configuration, it is possible to provide a copper-clad laminate from which a wiring board having a higher signal transmission speed and higher heat resistance can be suitably manufactured.

According to such a configuration, it is possible to provide a copper-clad laminate from which a wiring board exhibiting higher heat resistance can be suitably manufactured.

This is considered to be due to the following.

The fact that the nitrogen element is derived from the nitrogen atom contained in a compound having an amino group is considered to mean that a compound containing a nitrogen element which exists as an etching residue is a compound having an amino group. It is considered that this compound having an amino group more effectively exerts the effect of enhancing the interlayer adhesive property between the insulating layers and diminishing the occurrence of delamination. From this fact, it is considered that a copper-clad laminate is obtained from which a wiring board exhibiting higher heat resistance can be suitably manufactured.

A wiring board according to another aspect of the present invention includes wiring formed by partially removing the copper foil provided in the copper-clad laminate and the insulating layer.

According to such a configuration, it is possible to provide a wiring board having a high signal transmission speed and high heat resistance.

It is considered that this is because the wiring board is obtained using the copper-clad laminate. Specifically, as described above, it is considered that this is because the occurrence of delamination can be sufficiently suppressed since the amount of the compound containing a chromium element which exists between the wirings is small. It is considered that the signal transmission speed is high because the insulating layer has a low dielectric constant and a low dielectric loss tangent and the smoothness of the contact surface between the wiring and the insulating property is high as described above.

In the wiring board, it is preferable that a plurality of the insulating layers are provided and the wiring is disposed between the insulating layers.

According to such a configuration, it is possible to provide a multilayer wiring board having a high signal transmission speed and high heat resistance. Specifically, the wiring board is a multilayer wiring board, exhibits high heat resistance, and is unlikely to cause delamination even when being heated, and it is possible to suppress the occurrence of delamination between the insulating layers even when the wiring is disposed between the insulating layers.

A copper foil with resin according to another aspect of the present invention is a copper foil with resin including a resin layer and a copper foil in contact with at least one surface of the resin layer, in which the resin layer contains a resin composition containing a modified polyphenylene ether compound of which a terminal is modified with a substituent having a carbon-carbon unsaturated double bond or a semi-cured product of the resin composition, a chromium element amount on an exposed surface, on which the resin layer is exposed after the copper foil with resin in which the resin layer has been cured is etched with a copper chloride solution, measured by X-ray photoelectron spectroscopy is 7.5 at % or less with respect to a total element amount measured by X-ray photoelectron spectroscopy, and a surface roughness of the exposed surface is 2.0 μm or less in terms of ten-point average roughness.

According to such a configuration, it is possible to provide a copper foil with resin from which a wiring board having a higher signal transmission speed and higher heat resistance can be suitably manufactured.

This is considered to be due to the following.

First, the resin layer contains a resin composition containing the modified polyphenylene ether compound or a semi-cured product of the resin composition. From this fact, it is considered that the heat resistance of the insulating layer can be enhanced when the copper foil with resin is used in the manufacture of a wiring board, since the insulating layer obtained by curing the resin layer contains a cured product obtained by curing the resin composition or a semi-cured product of the resin composition.

It is considered that an etching residue derived from the copper foil exists on the exposed surface on which the resin layer is exposed after the copper foil with resin in which the resin layer has been cured is etched with a copper chloride solution. It is considered that when the amount of chromium element existing on the exposed surface as this etching residue is small as described above, the amount of chromium element also existing on the surface of the insulating layer existing between the wirings in the wiring board, namely, the amount of a compound containing a chromium element is small when the copper foil with resin is used in the manufacture of a wiring board. From this fact, it is considered that the copper foil with resin exhibits high heat resistance so that delamination can be sufficiently suppressed even when heating is performed.

The insulating layer obtained by curing the resin layer contains a cured product obtained by curing the resin composition or a semi-cured product of the resin composition. This cured product includes a cured product obtained by curing a resin composition containing the modified polyphenylene ether compound. Hence, the insulating layer obtained by curing the resin layer has a low dielectric constant and a low dielectric loss tangent. From this fact, it is considered that it is possible to diminish the transmission loss caused by the dielectric around the wiring and increase the signal transmission speed in this wiring board.

It is considered that the smoothness of the contact surface between the copper foil and the resin layer is also high since the surface roughness of the exposed surface is low. From this fact, it is considered that the smoothness of the contact surface between the wiring and the insulating layer obtained by curing the resin layer is also high when the copper foil with resin is used in the manufacture of a wiring board. It is considered that the signal for transmitting the wiring is concentrated near the surface of the conductor constituting the wiring by the skin effect. It is considered that this effect is more remarkable as the signal for transmitting the wiring has a higher frequency. As the contact surface between the wiring and the insulating layer is smooth, the signal flowing through the wiring flows near the surface having high smoothness and the transmission distance is shorter. From this fact, it is considered that it is possible to diminish the transmission loss caused by the conductor forming the wiring and increase the signal transmission speed in this wiring board.

From this fact, it is considered that it is possible to diminish the transmission loss caused by the conductor forming the wiring and the transmission loss caused by the dielectric around the wiring and increase the signal transmission speed in this wiring board.

From the above, it is considered that the copper-clad laminate is a copper-clad laminate from which a wiring board having a high signal transmission speed and high heat resistance can be suitably manufactured.

According to the present invention, it is possible to provide a copper-clad laminate and a copper foil with resin from which a wiring board having a high signal transmission speed and high heat resistance can be suitably manufactured. According to the present invention, it is also possible to provide a wiring board having a high signal transmission speed and high heat resistance.

Hereinafter, the present invention will be described more specifically with reference to Examples, but the scope of the present invention is not limited thereto.

EXAMPLES

Examples 1 to 7 and Comparative Examples 1 to 4

The respective components used when preparing resin compositions in the present Examples will be described.

(Modified Polyphenylene Ether Compound)

Modified PPE-1:

Modified polyphenylene ether obtained by reacting polyphenylene ether with chloromethylstyrene.

Specifically, this is a modified polyphenylene ether obtained by conducting reaction as follows.

First, 200 g of polyphenylene ether (SA90 manufactured by SABIC Innovative Plastics IP BV, number of terminal hydroxyl groups: 2, weight average molecular weight Mw: 1700), 30 g of a mixture containing p-chloromethylstyrene and m-chloromethylstyrene at a mass ratio of 50:50 (chloromethylstyrene: CMS manufactured by Tokyo Chemical Industry Co., Ltd.), 1.227 g of tetra-n-butylammonium bromide as a phase transfer catalyst, and 400 g of toluene were introduced into a 1-liter three-necked flask equipped with a temperature controller, a stirrer, cooling equipment, and a dropping funnel and stirred. The mixture was stirred until polyphenylene ether, chloromethylstyrene, and tetra-n-butylammonium bromide were dissolved in toluene. At that time, the mixture was gradually heated until the liquid temperature finally reached 75° C. Thereafter, an aqueous sodium hydroxide solution (20 g of sodium hydroxide/20 g of water) as an alkali metal hydroxide was added dropwise to the solution over 20 minutes. Thereafter, the mixture was further stirred at 75° C. for 4 hours. Next, the resultant in the flask was neutralized with hydrochloric acid at 10% by mass and then a large amount of methanol was added into the flask. By doing so, a precipitate was generated in the liquid in the flask. In other words, the product contained in the reaction solution in the flask was reprecipitated. Thereafter, this precipitate was taken out by filtration, washed three times with a mixed solution of methanol and water contained at a mass ratio of 80:20, and then dried under reduced pressure at 80° C. for 3 hours.

The obtained solid was analyzed by $^1$H-NMR (400 MHz, CDCl$_3$, TMS). As a result of NMR measurement, a peak attributed to a vinylbenzyl group (ethenylbenzyl group) was observed at 5 to 7 ppm. This made it possible to confirm that the obtained solid was a modified polyphenylene ether having a vinylbenzyl group as a substituent at the molecular terminal in the molecule. Specifically, it was confirmed that the obtained solid was ethenylbenzylated polyphenylene ether. The obtained modified polyphenylene ether compound was a modified polyphenylene ether compound represented by Formula (10), where Y was a dimethylmethylene group (a group represented by Formula (8), where $R_{32}$ and $R_{33}$ in Formula (8) were a methyl group), $R_1$ was a hydrogen atom, and $R_2$ was a methylene group.

The number of terminal functional groups in the modified polyphenylene ether was measured as follows.

First, the modified polyphenylene ether was accurately weighed. The weight at that time is defined as X (mg). Thereafter, this modified polyphenylene ether weighed was dissolved in 25 mL of methylene chloride, 100 μL of an ethanol solution of tetraethylammonium hydroxide (TEAH) at 10% by mass (TEAH:ethanol (volume ratio)=15:85) was added to the solution, and then the absorbance (Abs) of this mixture at 318 nm was measured using a UV spectrophotometer (UV-1600 manufactured by Shimadzu Corporation). Thereafter, the number of terminal hydroxyl groups in the modified polyphenylene ether was calculated from the measurement result using the following equation.

Residual OH amount(μmol/g)=[(25×Abs)/(ε×OPL×X)]×10$^6$

Here, ε indicates the extinction coefficient and is 4700 L/mol·cm. OPL indicates the cell path length and is 1 cm.

Since the calculated residual OH amount (the number of terminal hydroxyl groups) in the modified polyphenylene ether is almost zero, it was found that the hydroxyl groups in the polyphenylene ether before being modified are almost modified. From this fact, it was found that the number of terminal hydroxyl groups decreased from the number of terminal hydroxyl groups in polyphenylene ether before being modified is the number of terminal hydroxyl groups in polyphenylene ether before being modified. In other words, it was found that the number of terminal hydroxyl groups in polyphenylene ether before being modified is the number of terminal functional groups in the modified polyphenylene ether. In other words, the number of terminal functional groups was two.

The intrinsic viscosity (IV) of the modified polyphenylene ether was measured in methylene chloride at 25° C. Specifically, the intrinsic viscosity (IV) of the modified polyphenylene ether was measured in a methylene chloride solution (liquid temperature: 25° C.) of the modified polyphenylene ether at 0.18 g/45 ml using a viscometer (AVS500 Visco System manufactured by SCHOTT Instruments GmbH). As a result, the intrinsic viscosity (IV) of the modified polyphenylene ether was 0.09 dl/g.

The molecular weight distribution of the modified polyphenylene ether was measured by GPC. The weight average molecular weight (Mw) was calculated from the obtained molecular weight distribution. As a result, Mw was 2,300.

Modified PPE-2:

Modified polyphenylene ether compound that is a modified polyphenylene ether obtained by modifying the terminal hydroxyl groups of polyphenylene ether with a methacryl group (a group having a structure represented by Formula (11), where, in Formula (11), $R_3$ is a methyl group, Y is a dimethylmethylene group (represented by Formula (8), where $R_{32}$ and $R_{33}$ in Formula (8) are a methyl group), intrinsic viscosity (IV): 0.085 dl/g in methylene chloride at 25° C. as measured using SA9000 manufactured by SABIC Innovative Plastics, weight average molecular weight Mw: 2000, number of terminal functional groups: 1.8)

(Curing Agent: Thermosetting Curing Agent Having Two or More Carbon-Carbon Unsaturated Double Bonds at Molecular Terminal)

TAIC: Triallyl isocyanurate (thermosetting curing agent having three carbon-carbon unsaturated double bonds at molecular terminal, TAIC manufactured by Nihon Kasei CO., LTD., weight average molecular weight Mw: 249)

DVB: Divinylbenzene (thermosetting curing agent having two carbon-carbon unsaturated double bonds at molecular terminal, DVB810 manufactured by NIPPON STEEL CORPORATION, molecular weight: 130)

Epoxy compound: Dicyclopentadiene epoxy resin (HP-7200 manufactured by DIC Corporation)

Phenol novolac resin: Phenol novolac resin (TD2131 manufactured by DIC Corporation)

(Filler)

Silica 1: Spherical silica treated with vinylsilane (SC2300-SVJ manufactured by Admatechs Company Limited)

Silica 2: Spherical silica treated with aminosilane (SC2500-SXJ manufactured by Admatechs Company Limited)

(Initiator)

PBP: α,α'-Di(t-butylperoxy)diisopropylbenzene (Perbutyl P (PBP) manufactured by NOF CORPORATION)

Imidazole compound: 2-Ethyl-4-imidazole (2E4MZ manufactured by Shikoku Chemicals Corporation)

(Flame Retardant)

Flame retardant: SAYTEX 8010 manufactured by Albemarle Corporation

[Method of Preparing Resin Composition]

Next, a method of preparing a resin composition will be described.

First, the respective components other than the initiator were added to and mixed in toluene at the blending proportions presented in the following Table 1 so that the solid concentration was 60% by mass. The mixture was heated to 80° C. and stirred at 80° C. for 60 minutes. Thereafter, the stirred mixture was cooled to 40° C., and then the initiator was added thereto at the blending proportion presented in the following Table 1 to obtain a varnish-like curable composition (varnish). The mixture was stirred for 60 minutes to prepare a varnish-like resin composition (varnish).

[Method of Fabricating Copper-Clad Laminate]

Next, the obtained varnish was impregnated into a glass cloth and then heated and dried at 100° C. to 170° C. for about 3 to 6 minutes to fabricate a prepreg. Specifically, the glass cloth is #1078 type L glass manufactured by Asahi Kasei Corporation. At that time, the content (resin content) of the resin composition was adjusted to be about 66% by mass.

Next, two sheets of manufactured prepregs were superposed, the following copper foils presented in Table 1 were disposed on both sides of the superposed two prepregs to form a body to be pressed, and heating and pressing was performed for 100 minutes under the conditions of a temperature of 200° C. and a pressure of 3 MPa (megapascals) to fabricate a copper-clad laminate in which a copper foil was attached to both surfaces.

(Copper Foil)

Copper foil-1: Copper foil of which the entire surface is subjected to a surface treatment with a silane coupling agent having an amino group in the molecule (FV—WS (amino) manufactured by The Furukawa Electric Co., Ltd., copper foil treated with aminosilane, amount of chromium attached on M surface: 7.4 at %, ten-point average roughness Rz of M surface: 1.3 μm, thickness: 18 μm)

Copper foil-2: Copper foil of which the entire surface is subjected to a surface treatment with a silane coupling agent having a vinyl group in the molecule (FV—WS (low chromium) manufactured by The Furukawa Electric Co., Ltd., copper foil treated with vinylsilane, amount of chromium attached on M surface: 3.7 at %, ten-point average roughness Rz of M surface: 1.3 μm, thickness: 18 μm)

Copper foil-3: Copper foil of which the entire surface is subjected to a surface treatment with a silane coupling agent having an amino group in the molecule (TLC-V1 manufactured by Nan Ya Plastics Corporation, copper foil treated with aminosilane, amount of chromium attached on M surface: 1.8 at %, ten-point average roughness Rz of M surface: 1.3 μm, thickness: 18 μm)

Copper foil-4: Copper foil of which the entire surface is subjected to a surface treatment with a silane coupling agent having an amino group in the molecule (FX—WS manufactured by Tairi Furukawa Copper Foil Co., Ltd., copper foil treated with aminosilane, amount of chromium attached on M surface: 7.4 at %, ten-point average roughness Rz of M surface: 1.3 μm, thickness: 18 μm)

Copper foil-5: Copper foil of which the entire surface is subjected to a surface treatment with a silane coupling agent having an amino group in the molecule (VFPR1 manufactured by Chang Chun Japan Co., Ltd., copper foil treated with aminosilane, amount of chromium attached on M surface: 7.4 at %, ten-point average roughness Rz of M surface: 1.3 μm, thickness: 18 μm)

Copper foil-6: Copper foil of which the entire surface is subjected to a surface treatment with a silane coupling agent having a vinyl group in the molecule (FV—WS (vinyl) manufactured by The Furukawa Electric Co., Ltd., copper foil treated with vinylsilane, amount of chromium attached on M surface: 7.4 at %, ten-point average roughness Rz of M surface: 1.3 μm, thickness: 18 μm)

Copper foil-7: Copper foil of which the entire surface is subjected to a surface treatment with a silane coupling agent having an amino group in the molecule (MLS-G manufactured by MITSUI MINING & SMELTING CO., LTD., copper foil treated with aminosilane, amount of chromium attached on M surface: 2.2 at %, ten-point average roughness Rz of M surface: 2.8 μm, thickness: 18 μm)

[Chromium Element Amount and Nitrogen Element Amount]

The obtained copper-clad laminate was etched with a cupric chloride solution (liquid temperature: 45° C.) for 90 seconds and then washed with city water or pure water at room temperature. By doing so, the copper foil was removed.

The surface element analysis by XPS was performed on the surface (exposed surface) of the insulating layer exposed by the etching treatment. This surface elemental analysis was performed at a position where the photoelectrons emitted by the ionization of the sample were able to be detected at the strongest intensity by irradiating the M surface (contact surface) with X-rays under the following conditions from the direction perpendicular to the M surface in a vacuum and adjusting the irradiation height. As XPS, the measurement was performed under the following conditions using PHI 5000 Versaprobe manufactured by ULVAC-PHI, INCORPORATED.

X-Ray Used: Monochrome Al—Kα ray
X-ray beam diameter: Approximately 100 μmφ (25 W, 15 kV)
Analysis region: Approximately 100 μmφ

The value acquired by the measurement was quantitatively converted using the relative sensitivity coefficient incorporated in the analysis software provided in the apparatus.

As a result, the chromium element amount and nitrogen element amount with respect to the total element amount measured by XPS were measured.

[Surface Roughness Rz]

The surface roughness (ten-point average roughness Rz) of the exposed surface, the ten-point average roughness Rz that is the surface roughness here, was measured using a surface roughness and shape measuring instrument (SURF-COM 500DX) manufactured by TOKYO SEIMITSU CO., LTD. in conformity with JIS B 0601: 1994.

[Evaluation]

The copper-clad laminate (evaluation substrate) was evaluated by the methods described below.

[Transmission Loss]

One metal foil (copper foil) of the evaluation substrate (metal-clad laminate) was processed to form ten wirings having a line width of 100 to 300 μm, a line length of 1000 mm, and a line spacing of 20 mm. A three-layer plate was fabricated by secondarily stacking two sheets of the prepreg and the metal foil (copper foil) on the surface of the substrate on which this wiring has been formed on the side on which the wiring has been formed. The line width of the wiring was adjusted so that the characteristic impedance of the wiring after the three-layer plate was fabricated was 50Ω.

The transmission loss (passing loss) (dB/m) of the wiring formed on the obtained three-layer plate at 12.5 GHz was measured using a network analyzer (N5230A developed by Keysight Technologies).

[Solder Heat Resistance]

When fabricating the evaluation substrate, prepregs were stacked one by one on the front and back of the copper-clad laminate of which the entire surface has been etched, and heating and pressing was performed for 100 minutes under the conditions of a temperature of 200° C. and a pressure of 3 MPa to obtain a copper-clad laminate in which a copper foil was attached to both surfaces. This formed copper-clad laminate was cut into 50 mm×50 mm and the copper foils on both surfaces were removed by etching. The laminate for evaluation thus obtained was immersed in a solder bath at 288° C. for 30 seconds. Thereafter, the immersed laminate was visually observed to confirm the occurrence of swelling. Two laminates were subjected to this observation. It was evaluated as "Good" if swelling was not confirmed (if the number of swelling occurrences was 0). It was evaluated as "Fair" if the number of swelling occurrences was 1, and it was evaluated as "Poor" if the number of swelling occurrences was 2.

[Boiling Solder Heat Resistance 1]

A laminate for evaluation was obtained in the same manner as in the evaluation of solder heat resistance, and the evaluation was performed in the same manner as the evaluation of solder heat resistance except that the laminate for evaluation was immersed in boiling ion-exchanged water for 4 hours before being immersed in a solder bath at 288° C. for 30 seconds. The evaluation criteria were also similar to those in the evaluation of solder heat resistance.

[Boiling Solder Heat Resistance 2]

A laminate for evaluation was obtained in the same manner as in the evaluation of solder heat resistance, and the evaluation was performed in the same manner as the evaluation of solder heat resistance except that the laminate for evaluation was immersed in boiling ion-exchanged water for 6 hours before being immersed in a solder bath at 288° C. for 30 seconds. The evaluation criteria were also similar to those in the evaluation of solder heat resistance.

The results of the respective evaluations are presented in Table 1. For each metal-clad laminate, it is indicated that the copper foil marked with "Yes" in the column of copper foil in Table 1 was used.

This application is based on Japanese Patent Application No. 2018-190282 filed on Oct. 5, 2018, the contents of which are included in the present application.

In order to express the present invention, the present invention has been described above appropriately and sufficiently through the embodiments. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

TABLE 1

| | | | Examples | | | | | | | Comparative Example | | | |
|---|---|---|---|---|---|---|---|---|---|---|---|---|---|
| | | | 1 | 2 | 3 | 4 | 5 | 6 | 7 | 1 | 2 | 3 | 4 |
| Resin composition (parts by mass) | Modified PPE | Modified PPE-1 | 70 | 70 | 70 | — | 70 | 70 | 70 | 70 | — | — | 70 |
| | | Modified PPE-2 | — | — | — | 70 | — | — | — | — | 70 | — | — |
| | Curing agent | DVB | 30 | 30 | 30 | 30 | — | 30 | 30 | 30 | 30 | — | 30 |
| | | TAIC | — | — | — | — | 30 | — | — | — | — | — | — |
| | Filler | Silica 1 | 60 | 60 | 60 | 60 | 60 | 60 | 60 | 60 | 60 | — | 60 |
| | | Silica 2 | — | — | — | — | — | — | — | — | — | 60 | — |
| | Epoxy compound | | — | — | — | — | — | — | — | — | — | 60 | — |
| | Phenol novolac compound | | — | — | — | — | — | — | — | — | — | 40 | — |
| | PBP | | 2 | 2 | 2 | 2 | 2 | 2 | 2 | 2 | 2 | — | 2 |
| | Imidazole compound | | — | — | — | — | — | — | — | — | — | 0.05 | — |
| | Flame retardant | | 22 | 22 | 22 | 22 | 22 | 22 | 22 | 22 | 22 | 22 | 22 |
| Copper foil | Copper foil-1 | | Yes | — | — | — | — | — | — | — | — | — | — |
| | Copper foil-2 | | — | Yes | — | — | — | — | — | — | — | — | — |
| | Copper foil-3 | | — | — | Yes | Yes | Yes | — | — | — | — | Yes | — |
| | Copper foil-4 | | — | — | — | — | — | Yes | — | — | — | — | — |
| | Copper foil-5 | | — | — | — | — | — | — | Yes | — | — | — | — |
| | Copper foil-6 | | — | — | — | — | — | — | — | Yes | Yes | — | — |
| | Copper foil-7 | | — | — | — | — | — | — | — | — | — | — | Yes |
| XPS analysis | Chromium element amount (at %) | | 7.4 | 3.6 | 0.4 | 0.4 | 0.4 | 6.5 | 5.8 | 7.7 | 7.7 | 0.1 | 0.3 |
| | Nitrogen element amount (at %) | | 1.5 | 0 | 3.7 | 3.7 | 3.7 | 2.5 | 2.6 | 0 | 0 | 2.5 | 1.0 |
| Surface roughness Rz (μm) | | | 1.1 | 1.1 | 1.1 | 1.1 | 1.1 | 1.0 | 1.1 | 1.1 | 1.1 | 1.1 | 2.8 |
| Evaluation | Transmission loss (dB/m) | | −20 | −20 | −20 | −20 | −20 | −20 | −20 | −20 | −20 | −60 | −24 |
| | Solder heat resistance | | Good | Good | Good | Good | Good | Good | Good | Good | Good | Good | Good |
| | Boiling solder heat resistance 1 | | Good | Good | Good | Good | Good | Good | Good | Poor | Poor | Poor | Good |
| | Boiling solder heat resistance 2 | | Fair | Fair | Good | Good | Good | Good | Good | Poor | Poor | Poor | Good |

As can be seen from Table 1, in the cases (Examples 1 to 7) of copper-clad laminates obtained using copper foils in which the chromium element amount on the exposed surface obtained by XPS measurement was 7.5 at % or less and the surface roughness of the exposed surface was 2.0 μm or less in terms of ten-point average roughness, the transmission loss was low and the heat resistance was high as compared with other cases (Comparative Examples 1 to 4). For example, the copper-clad laminates according to Examples 1 to 7 exhibited higher heat resistance as compared with the cases (Comparative Example 1 and Comparative Example 2) where the chromium element amount exceeded 7.5 at %. The copper-clad laminates according to Examples 1 to 7 had a lower transmission loss as compared with the case (Comparative Example 3) where the insulating layer was not a resin composition containing the modified polyphenylene ether compound but was a resin composition containing an epoxy compound and a phenol novolac compound. The copper-clad laminates according to Examples 1 to 7 had a lower transmission loss as compared with the case (Comparative Example 4) where the surface roughness of the exposed surface exceeded 2.0 μm in terms of ten-point average roughness.

INDUSTRIAL APPLICABILITY

According to the present invention, there are provided a copper-clad laminate and a copper foil with resin from which a wiring board having a high signal transmission speed and high heat resistance can be suitably manufactured. According to the present invention, there is also provided a wiring board having a high signal transmission speed and high heat resistance.

The invention claimed is:

1. A copper-clad laminate comprising an insulating layer and a
copper foil in contact with at least one surface of the insulating layer, the copper foil having a layer treated with a silane coupling agent having an amino group in the molecule as a silane coupling agent layer,
wherein the insulating layer contains a cured product of a resin composition containing a modified polyphenylene ether compound of which a terminal is modified with a substituent having a carbon-carbon unsaturated double bond, a chromium element amount on an exposed surface, on which the insulating layer is exposed by an etching treatment of the copper-clad laminate with a copper chloride solution, measured by X-ray photoelectron spectroscopy is 7.5 at % or less with respect to a total element amount measured by X-ray photoelectron spectroscopy, and a surface roughness of the exposed surface is 2.0 μm or less in terms of ten-point average roughness, and wherein the thickness of the silane coupling agent layer is sufficient to cause a a nitrogen element that can be confirmed by X-ray photoelectron spectroscopy to exist on the exposed surface upon etching treatment of the copper-clad laminate and exposure of the insulating layer.

2. The copper-clad laminate according to claim 1, wherein the substituent is a group represented by the following Formula (1) or the following Formula (2):

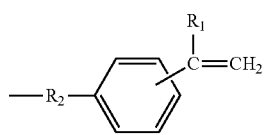

wherein in Formula (1), $R_1$ represents a hydrogen atom or an alkyl group having 1 to 10 carbon atoms and $R_2$ represents an alkylene group having 1 to 10 carbon atoms or a direct bond,

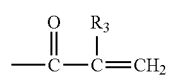

wherein in Formula (2), $R_3$ represents a hydrogen atom or an alkyl group having 1 to 10 carbon atoms.

3. The copper-clad laminate according to claim 1, wherein a nitrogen element amount on the exposed surface measured by X-ray photoelectron spectroscopy is 1.0 at % or more with respect to a total element amount measured by X-ray photoelectron spectroscopy.

4. The copper-clad laminate according to claim 1, wherein the nitrogen element is derived from a nitrogen atom contained in a compound having an amino group.

5. A wiring board comprising:
wiring formed by partially removing the copper foil provided in the copper-clad laminate according to claim 1; and
the insulating layer.

6. The wiring board according to claim 5, wherein
a plurality of the insulating layers are provided, and
the wiring is disposed between the insulating layers.

7. A copper foil with resin, comprising a resin layer and a copper foil in contact with at least one surface of the resin layer,
wherein the copper foil having a layer treated with a silane coupling agent having an amino group in the molecule as a silane coupling agent layer,
the resin layer contains a resin composition containing a modified polyphenylene ether compound of which a terminal is modified with a substituent having a carbon-carbon unsaturated double bond or a semi-cured product of the resin composition,
a chromium element amount on an exposed surface, on which the resin layer is exposed after the copper foil with resin in which the resin layer has been cured is etched with a copper chloride solution, measured by X-ray photoelectron spectroscopy is 7.5 at % or less with respect to a total element amount measured by X-ray photoelectron spectroscopy, and
a surface roughness of the exposed surface is 2.0 μm or less in terms of ten-point average roughness, and
wherein the thickness of the silane coupling agent layer is sufficient to cause a nitrogen element that can be confirmed by X-ray photoelectron spectroscopy to exist on the exposed surface upon etching treatment of the copper foil with resin and exposure of the resin layer.

* * * * *